(12) United States Patent
Kato et al.

(10) Patent No.: US 8,372,202 B2
(45) Date of Patent: Feb. 12, 2013

(54) FILM DEPOSITION APPARATUS

(75) Inventors: Hitoshi Kato, Oshu (JP); Manabu Honma, Oshu (JP)

(73) Assignee: Tokyo Electron Limited, Tokyo (JP)

( * ) Notice: Subject to any disclaimer, the term of this patent is extended or adjusted under 35 U.S.C. 154(b) by 626 days.

(21) Appl. No.: 12/539,633

(22) Filed: Aug. 12, 2009

(65) Prior Publication Data

US 2010/0055314 A1 Mar. 4, 2010

(30) Foreign Application Priority Data

Aug. 29, 2008 (JP) ................................ 2008-222733

(51) Int. Cl.
*C23C 16/455* (2006.01)
*C23C 16/00* (2006.01)
(52) U.S. Cl. ........................................ 118/719; 118/730
(58) Field of Classification Search ................. 118/730, 118/719
See application file for complete search history.

(56) References Cited

U.S. PATENT DOCUMENTS

| | | | |
|---|---|---|---|
| 6,254,686 B1 * | 7/2001 | Comita et al. ................ | 118/724 |
| 7,153,542 B2 | 12/2006 | Nguyen et al. | |
| 2002/0066535 A1 * | 6/2002 | Brown et al. ............ | 156/345.29 |
| 2007/0218701 A1 | 9/2007 | Shimizu et al. | |
| 2007/0218702 A1 * | 9/2007 | Shimizu et al. ............... | 438/758 |
| 2009/0324826 A1 * | 12/2009 | Kato et al. ............... | 427/255.28 |

FOREIGN PATENT DOCUMENTS

| | | |
|---|---|---|
| JP | 2001-254181 | 9/2001 |
| JP | 2007-247066 | 9/2007 |

\* cited by examiner

*Primary Examiner* — Parviz Hassanzadeh
*Assistant Examiner* — Nathan K Ford
(74) *Attorney, Agent, or Firm* — IPUSA, PLLC

(57) ABSTRACT

A disclosed film deposition apparatus includes a turntable including a substrate receiving area; a first reaction gas supplier for supplying a first reaction gas to a surface of the turntable having the substrate receiving area; a second reaction gas supplier, arranged away from the first reaction gas supplier along a circumferential direction of the turntable, for supplying a second reaction gas to the surface; a separation area located along the circumferential direction between a first process area of the first reaction gas and a second process area of the second reaction gas; a separation gas supplier for supplying a first separation gas to both sides of the separation area; a first heating unit for heating the first separation gas to the separation gas supplier; an evacuation opening for evacuating the gases supplied to the turntable; and a driver for rotating the turntable in the circumferential direction.

8 Claims, 20 Drawing Sheets

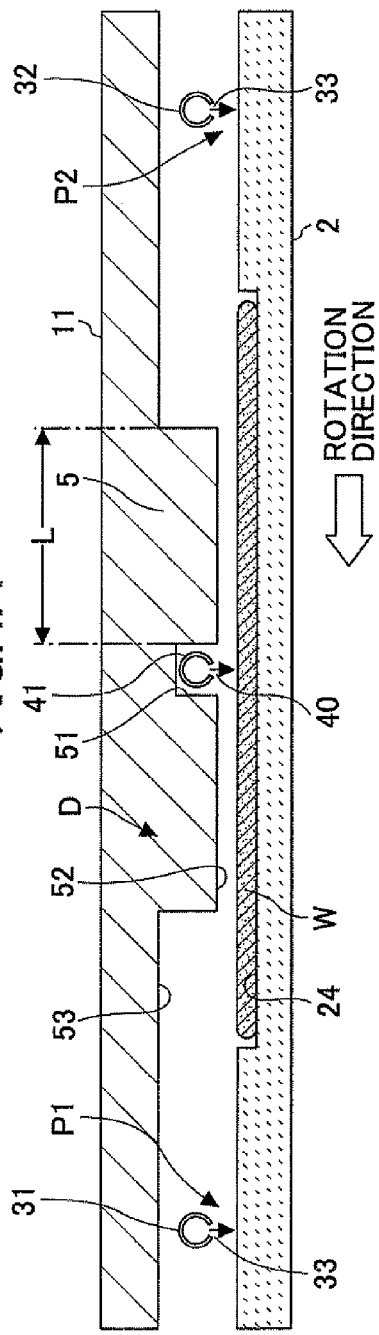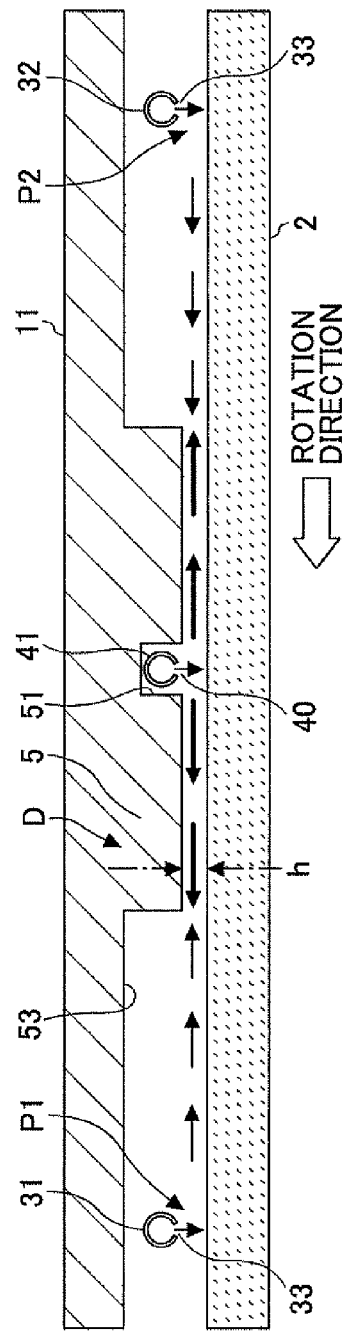

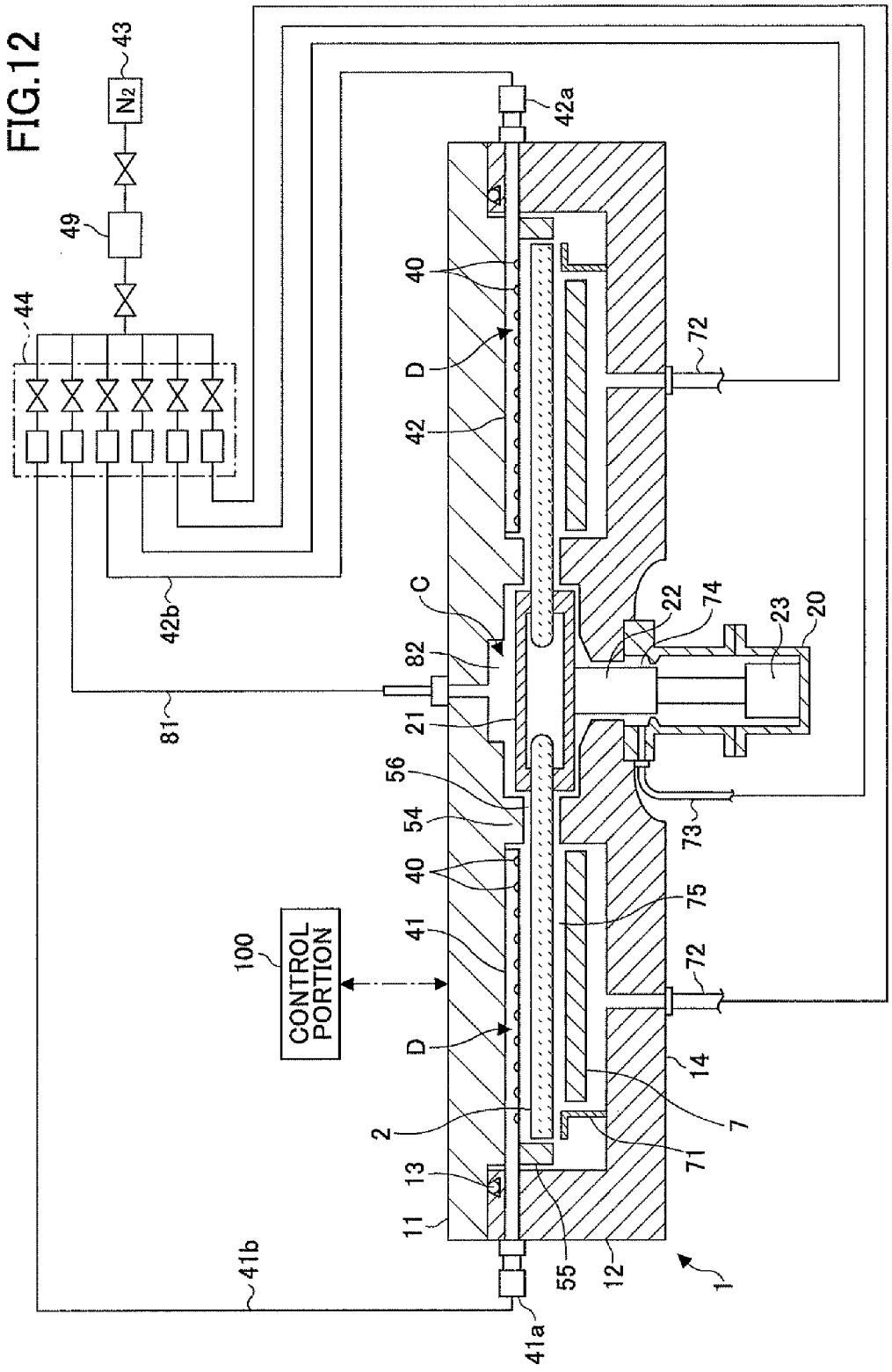

FILM DEPOSITION APPARATUS

CROSS-REFERENCE TO RELATED APPLICATIONS

The present application is based on Japanese Patent Application No. 2008-222733 filed with the Japanese Patent Office on Aug. 29, 2008, the entire contents of which are hereby incorporated herein by reference.

BACKGROUND OF THE INVENTION

1. Field of the Invention

The present invention relates to a film deposition apparatus and a film deposition method for depositing a film on a substrate by carrying out plural cycles of supplying in turn at least two source gases to the substrate in order to form plural layers of a reaction product, and a storage medium storing a computer program for carrying out the film deposition method.

2. Description of the Related Art

As a film deposition technique in a semiconductor fabrication process, there has been known a so-called Atomic Layer Deposition (ALD) or Molecular Layer Deposition (MLD), in which a first reaction gas is adsorbed on a surface of a semiconductor wafer (referred to as a wafer hereinafter) under vacuum and then a second reaction gas is adsorbed on the surface of the wafer in order to form one or more atomic or molecular layers through reaction of the first and the second reaction gases on the surface of the wafer, and such an alternating adsorption of the gases is repeated plural times, thereby depositing a film on the wafer. This technique is advantageous in that the film thickness can be controlled at higher accuracy by the number of times of supplying in turn the gases, and in that the deposited film can have excellent uniformity over the wafer. Therefore, this deposition method is thought to be promising as a film deposition technique that can address further miniaturization of semiconductor devices.

Such a film deposition method may be preferably used, for example, for depositing a dielectric material to be used as a gate insulator. When silicon dioxide ($SiO_2$) is deposited as the gate insulator, a bis (tertiary-butylamino) silane (BTBAS) gas or the like is used as a first reaction gas (source gas) and ozone gas or the like is used as a second gas (oxidation gas).

In order to carry out such a deposition method, use of a single-wafer deposition apparatus having a vacuum chamber and a shower head at a top center portion of the vacuum chamber and a deposition method using such an apparatus has been under consideration. In the deposition apparatus, the reaction gases are introduced into the chamber from the top center portion, and unreacted gases and by-products are evacuated from a bottom portion of the chamber. When such a deposition chamber is used, it takes a long time for a purge gas to purge the reaction gases, resulting in an extremely long process time because the number of cycles may reach several hundred. Therefore, a deposition method and apparatus that enable high throughput is desired.

Under these circumstances, film deposition apparatuses having a vacuum chamber and a turntable that holds plural wafers along a rotation direction have been proposed in order to carry out ALD or MLD. Specifically, such a deposition apparatus has plural process areas where corresponding reaction gases are supplied, the process areas being positioned away from one another along the rotation direction of the turntable, and a separation area including a separation gas supplying member for supplying a separation gas in areas between adjacent process areas along the rotation direction in order to separate the atmospheres of the process areas.

At the time of depositing films, the separation gas is supplied from the separation gas supplying member and spreads in both directions in relation to the rotation direction of the turntable. As a result, a separation area is created that impedes the reaction gases from being mixed. The reaction gases are evacuated along with the separation gas that has spread in both directions in relation to the rotation direction of the turntable from an evacuation port. While the reaction gases are supplied in the process areas and the separation gas is supplied in the separation area in such a manner, wafers placed on the turntable are repeatedly moved from one process area to the other process area by rotating the turntable, and thus the ALD or MLD is carried out. According to such a deposition apparatus, because gas purging in the process chamber is not necessary and a film can be concurrently deposited on plural wafers, high throughput is expected.

In the above deposition apparatus, if the reaction gases flow into the separation area and the reaction gases are mixed, normal film deposition becomes impossible. For example, no film may be deposited on the wafers, or film thickness may vary over the wafer. In order to avoid gas mixture of the reaction gases, the separation gas needs to be supplied at a high flow speed. To this end, it may be required to increase a flow rate of the separation gas. However, when the flow rate of the separation gas is increased, the separation gas flows into the process areas and dilutes the reaction gases, and thus the deposition efficiency may be reduced. In order to avoid such a problem, it may be advantageous to increase a gas evacuation amount from the evacuation port. However, this may increase an evacuation load of the evacuation apparatus such as a vacuum pump connected to the evacuation port.

Patent Document 1 listed below discloses a deposition apparatus whose process chamber has a shape of a flattened cylinder. The process chamber is divided into two half circle areas. Each area has an evacuation port provided to surround the area at the top portion of the corresponding area. In addition, the process chamber has a gas inlet port that introduces separation gas between the two areas along a diameter of the process chamber. With these configurations, while different reaction gases are supplied into the corresponding areas and evacuated from above by the corresponding evacuation ports, a turntable is rotated so that the wafers placed on the turntable can alternately pass through the two areas.

Patent Document 2 discloses a process chamber in which four wafers are placed on a wafer support member (rotation table) at equal angular intervals along a rotation direction of the wafer support member, first and second gas ejection nozzles are located along the rotation direction and oppose the wafer support member, and purge nozzles that are located between the first and the second gas ejection nozzles. In this process chamber, the wafer support member is horizontally rotated in order to deposit a film on the wafers.

However, these documents do not describe any configurations of reducing an amount of the separation gases, and thus the above problem cannot be solved by these documents.

Patent Document 3 (Patent Documents 4, 5) discloses a film deposition apparatus preferably used for an Atomic Layer CVD that causes plural gases to be alternately adsorbed on a target (a wafer). In this apparatus, a susceptor holding the wafer is rotated, while source gases and purge gases are supplied to the susceptor from above. Paragraphs 0023-0025 of the document describe partition walls that extend in a radial direction from a center of a chamber, and gas ejection holes that are formed in a bottom of the partition walls in order to supply the source gases or the purge gases. An inert gas as the purge gas is ejected from the gas ejection holes, thereby producing a gas curtain. However, this document does not show a technique reducing a flow rate of the purge gas.

Patent Document 1: U.S. Pat. No. 7,153,542 (FIGS. 6A, 6B)

Patent Document 2: Japanese Patent Application Laid-Open Publication No. 2001-254181 (FIGS. 1, 2)

Patent Document 3: Japanese Patent Application Laid-Open Publication No. 2007-247066 (paragraphs 0023 through 0025, 0058, FIGS. 12 and 18)

Patent Document 4: United States Patent Publication No. 2007/218701

Patent Document 5: United States Patent Publication No. 2007/218702

SUMMARY OF THE INVENTION

The present invention has been made in view of the above, and provides a film deposition apparatus and a film deposition method for depositing a film on a substrate by carrying out plural cycles of supplying in turn at least two source gases to the substrate in order to form plural layers of a reaction product, wherein an amount of a separation gas supplied to a separation area for separating atmospheres of a first process area to which a first reaction gas is supplied and a second process area to which a second reaction gas is supplied, the first and the second process areas being arranged away from each other in a circumferential direction of a turntable on which the substrate is placed, can be reduced, and a storage medium storing a computer program for carrying out the film deposition method.

A first aspect of the present invention provides a film deposition apparatus for depositing a film on a substrate by carrying out a cycle of supplying in turn at least two kinds of reaction gases that react with each other to the substrate to produce a layer of a reaction product in a chamber. This film deposition apparatus includes a turntable provided in the chamber and includes a substrate receiving area in which the substrate is placed; a first reaction gas supplying portion configured to supply a first reaction gas to a surface of the turntable, the surface having the substrate receiving area; a second reaction gas supplying portion configured to supply a second reaction gas to the surface, the second reaction gas supplying portion being arranged away from the first reaction gas supplying portion along a circumferential direction of the turntable; a separation area located along the circumferential direction between a first process area in which the first reaction gas is supplied and a second process area in which the second reaction gas is supplied, in order to separate atmospheres of the first process area and the second process area; a separation gas supplying portion configured to supply a first separation gas that spreads on both sides of the separation area; a first heating unit configured to heat the first separation gas supplied to the separation gas supplying portion; an evacuation opening through which the first reaction gas, the second reaction gas, and the first separation gas supplied to the turntable are evacuated; and a driving portion configured to rotate the turntable in the circumferential direction relative to the first process area, the second process area, and the separation area while the first reaction gas, the second reaction gas, and the first separation gas are supplied to the turntable in order to deposit a film on the substrate.

A second aspect of the present invention provides a film deposition method for depositing a film on a substrate by carrying out a cycle of supplying in turn at least two kinds of reaction gases that react with each other to the substrate to produce a layer of a reaction product in a chamber. This film deposition method includes steps of substantially horizontally placing the substrate on a turntable in a chamber; supplying a first reaction gas from a first reaction gas supplying portion to a surface of the turntable, the surface having a substrate receiving area in which the substrate is placed; supplying a second reaction gas to the surface of the turntable from a second reaction gas supplying portion arranged away from the first reaction gas supplying portion along a circumferential direction of the turntable; supplying a first separation gas from a separation gas supplying portion provided in a separation area located between a first process area in which the first reaction gas is supplied and a second process area in which the second reaction gas is supplied, in order to separate atmospheres of the first process area and the second process area; heating the first separation gas supplied to the separation gas supplying portion; rotating the turntable in the circumferential direction relative to the first process area, the second process area, and the separation area while the first reaction gas, the second reaction gas, and the first separation gas are supplied to the turntable in order to deposit a film on the substrate; and evacuating the first reaction gas, the second reaction gas, and the first separation gas supplied to the turntable through an evacuation opening.

A third aspect of the present invention provides a storage medium storing a program used in a film deposition apparatus for depositing a film on a substrate by carrying out a cycle of supplying in turn at least two kinds of reaction gases that react with each other to the substrate to produce a layer of a reaction product, the program including a group of steps for carrying out the film deposition method of the second aspect.

BRIEF DESCRIPTION OF THE DRAWINGS

FIGS. 4A and 4B are developed cross-sectional view showing a separation area and process areas;

FIG. 12 is a cross-sectional view of a film deposition apparatus according to another embodiment of the present invention;

DETAILED DESCRIPTION OF THE PREFERRED EMBODIMENT

Figure 1:
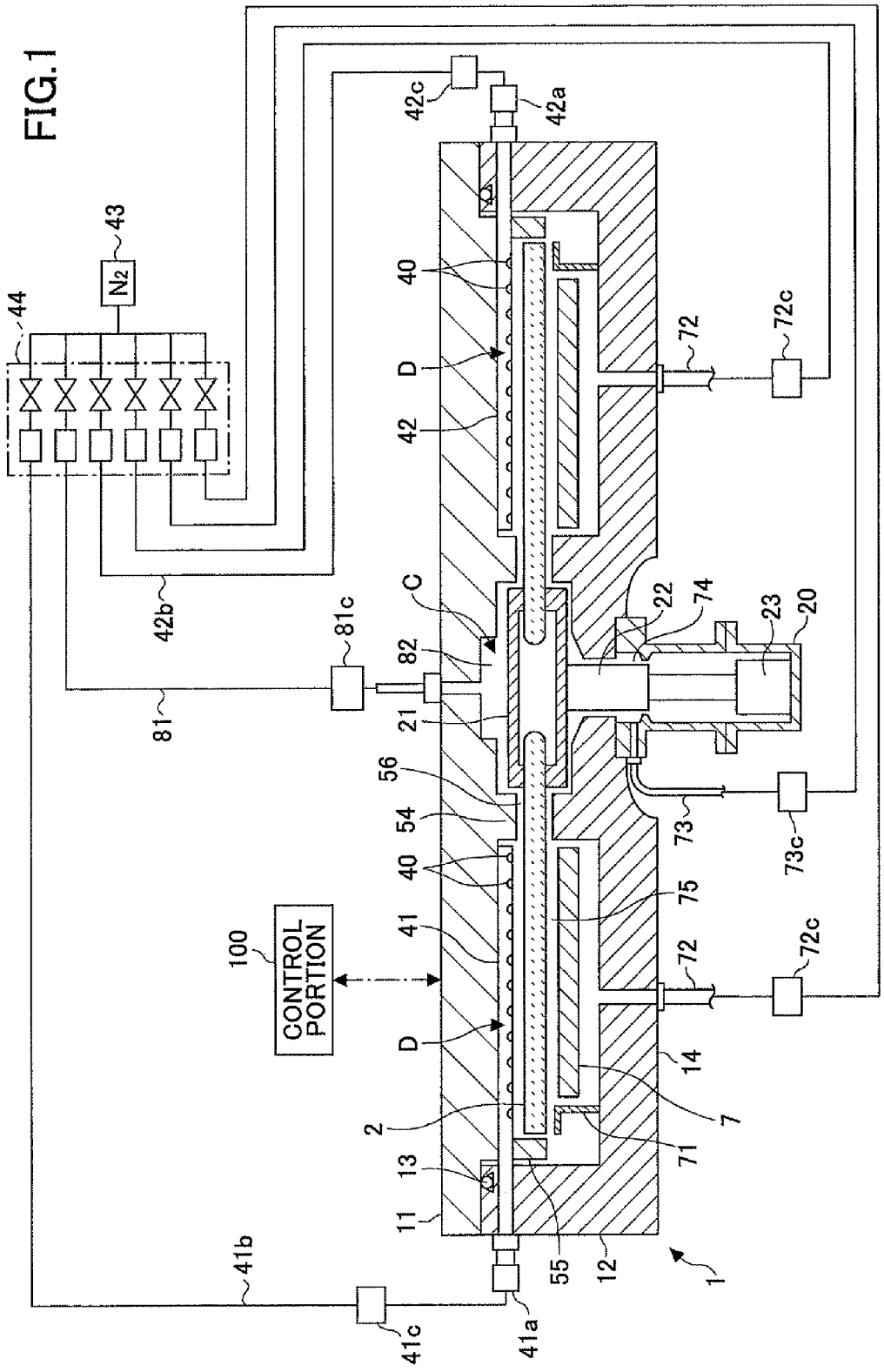
FIG. 1 is a cut-away diagram of a film deposition apparatus according to an embodiment of the present invention.

According to an embodiment of the present invention, an amount of a separation gas used can be reduced because the separation gas is heated to increase its volume and supplied at a higher flow speed to a turntable in a vacuum chamber from a separation gas supplying member.

Non-limiting, exemplary embodiments of the present invention will now be described with reference to the accompanying drawings. In the drawings, the same or corresponding reference marks are given to the same or corresponding members or components. It is noted that the drawings are illustrative of the invention, and there is no intention to indicate scale or relative proportions among the members or components. Therefore, the specific size should be determined by a person having ordinary skill in the art in view of the following non-limiting embodiments.

FIG. 1 shows a film deposition apparatus according to an embodiment of the present invention. FIG. 1 is a cut-away diagram taken along an extending direction of separation gas nozzles 41, 42 (described later), or a cut-away diagram taken along I-I' line in FIG. 3. As shown in this drawing, the film deposition apparatus according to an embodiment of the present invention has a vacuum chamber 1 having substantially a flattened cylinder shape, and a turntable 2 that is located inside the vacuum chamber 1 and has a rotation center at a center of the vacuum chamber 1. The vacuum chamber 1 is made so that a ceiling plate 11 can be separated from a chamber body 12. The ceiling plate 11 is pressed onto the chamber body 12 via a ceiling member such as an O ring 13 when the inside of the vacuum chamber is maintained at a reduced pressure, according to which the vacuum chamber 1 is assuredly hermetically sealed. On the other hand, the ceiling plate 11 can be raised by a driving mechanism (not shown) when the ceiling plate 11 has to be removed from the chamber body 12.

The turntable 2 is fixed onto a cylindrically shaped core portion 21 at substantially the center of the vacuum chamber 1. The core portion 21 is fixed on a top end of a rotational shaft 22 that extends in a vertical direction. The rotational shaft 22 penetrates a bottom portion 14 of the chamber body 12 and is fixed at the lower end to a driving mechanism 23 that can rotate the rotational shaft 22 clockwise, in this embodiment. The rotational shaft 22 and the driving mechanism 23 are housed in a case body 20 having a cylinder with a bottom. The case body 20 has flanged pipe portion 20a at the top and is hermetically fixed to a bottom surface of the bottom portion 14 via the flanged pipe portion 20a.

Figure 2:
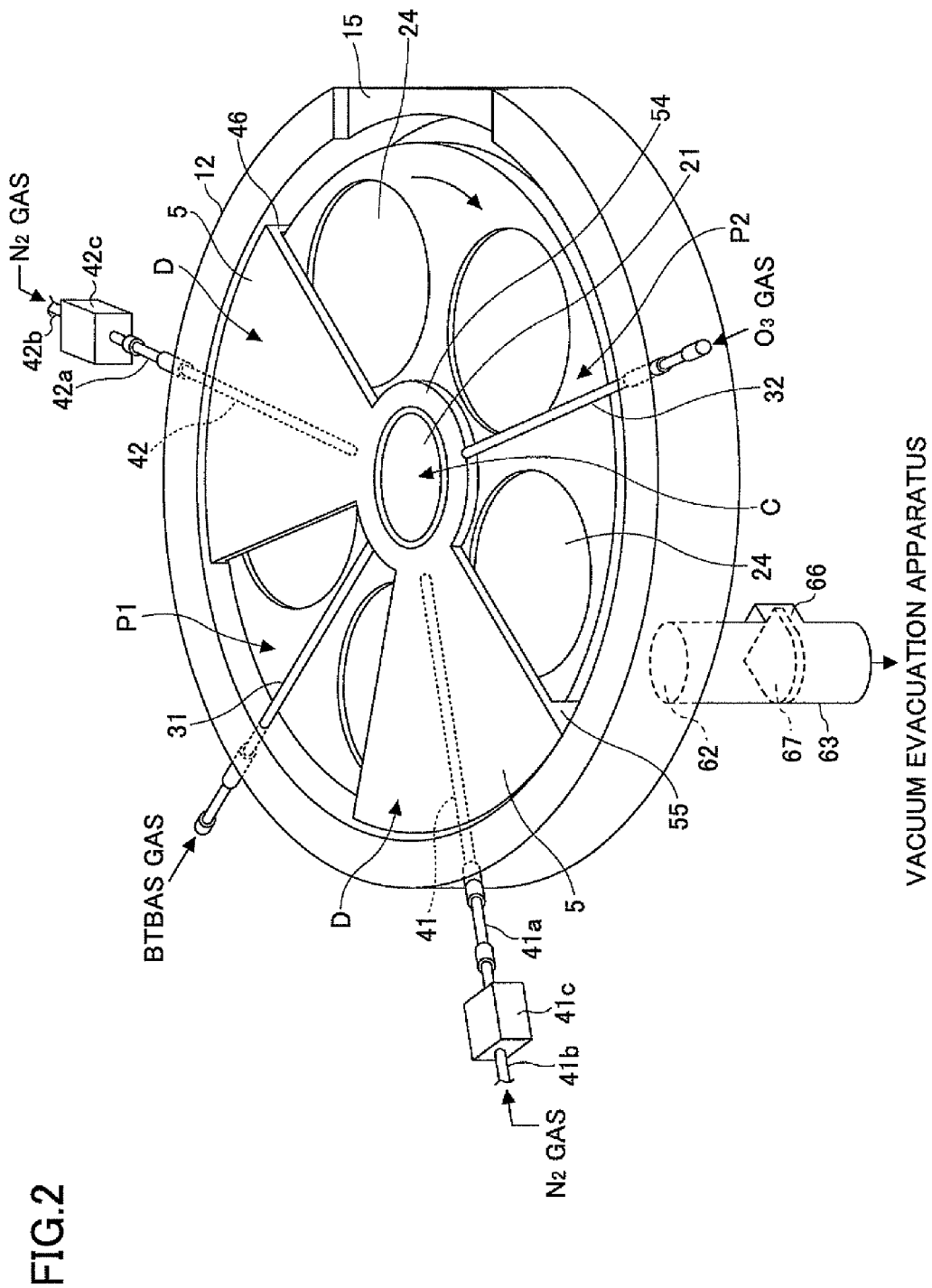
FIG. 2 is a perspective view of the film deposition apparatus of FIG. 1.
Figure 3:
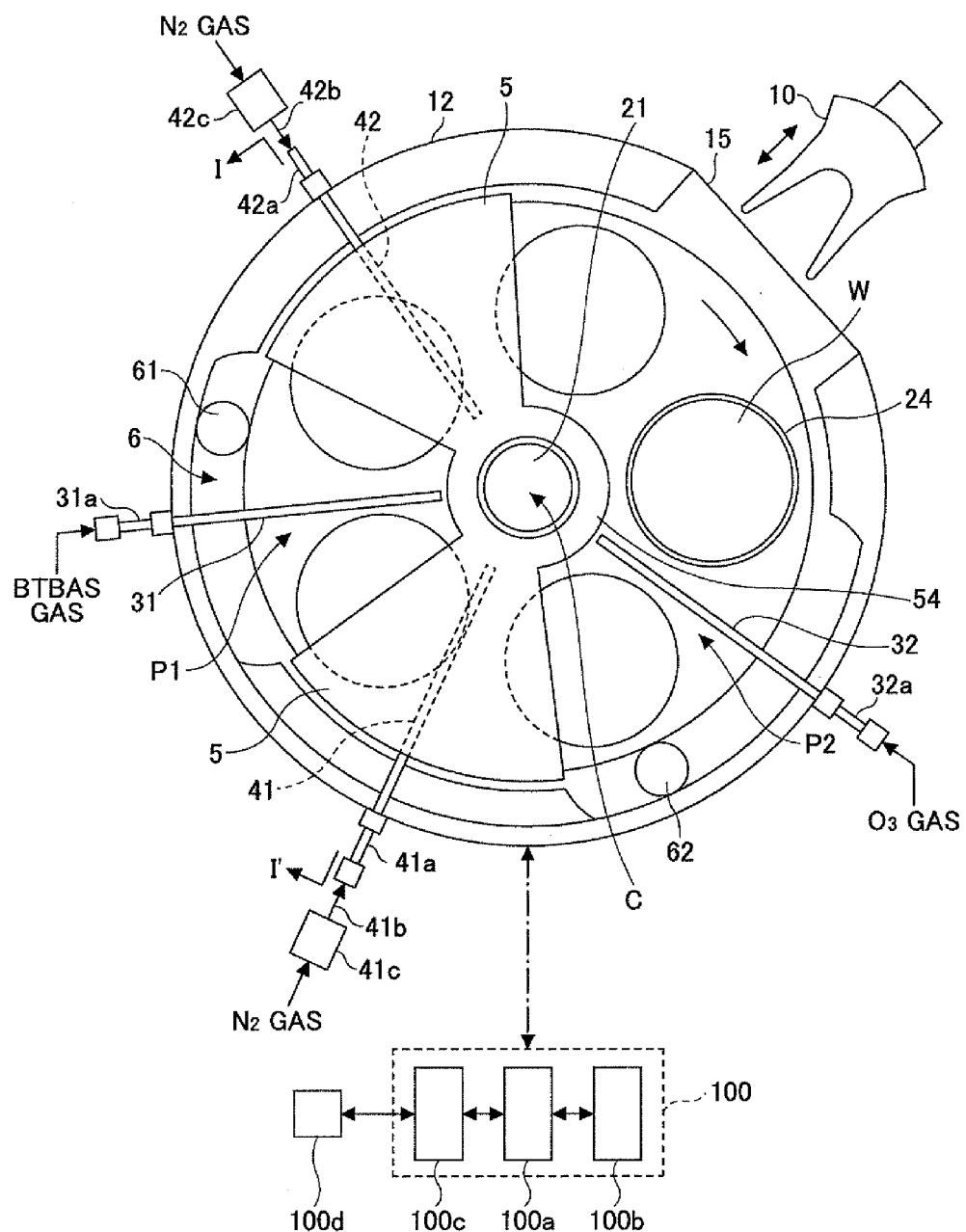
FIG. 3 is a plan view of the film deposition apparatus of FIG. 1.

As shown in FIGS. 2 and 3, plural (for example, five) circular concave portions 24, which are substrate receiving area in which corresponding wafers W are placed, are formed along the rotation direction (circumferential direction) in a top surface of the turntable 2. The concave portion 24 has a diameter slightly larger than the diameter of the wafer W and positions the wafer W, thereby preventing the wafer W from being thrown out by centrifugal force caused by rotation of the turntable 2. For simplicity of illustration, only one wafer W is illustrated in FIG. 3.

FIGS. 4A and 4B are a projected cross-sectional diagram taken along a circle concentric to the turntable 2. As shown in FIG. 4A, when the wafer W is placed in the concave portion 24, a surface of the wafer W is at the same elevation of a surface of an area of the turntable 2, the area excluding the concave portions 24. With this, pressure changes caused by an elevation difference between the surface of the wafer W and the surface of the turntable 2 are reduced, and thus an across-wafer uniformity of a film thickness is improved.

Figure 5:
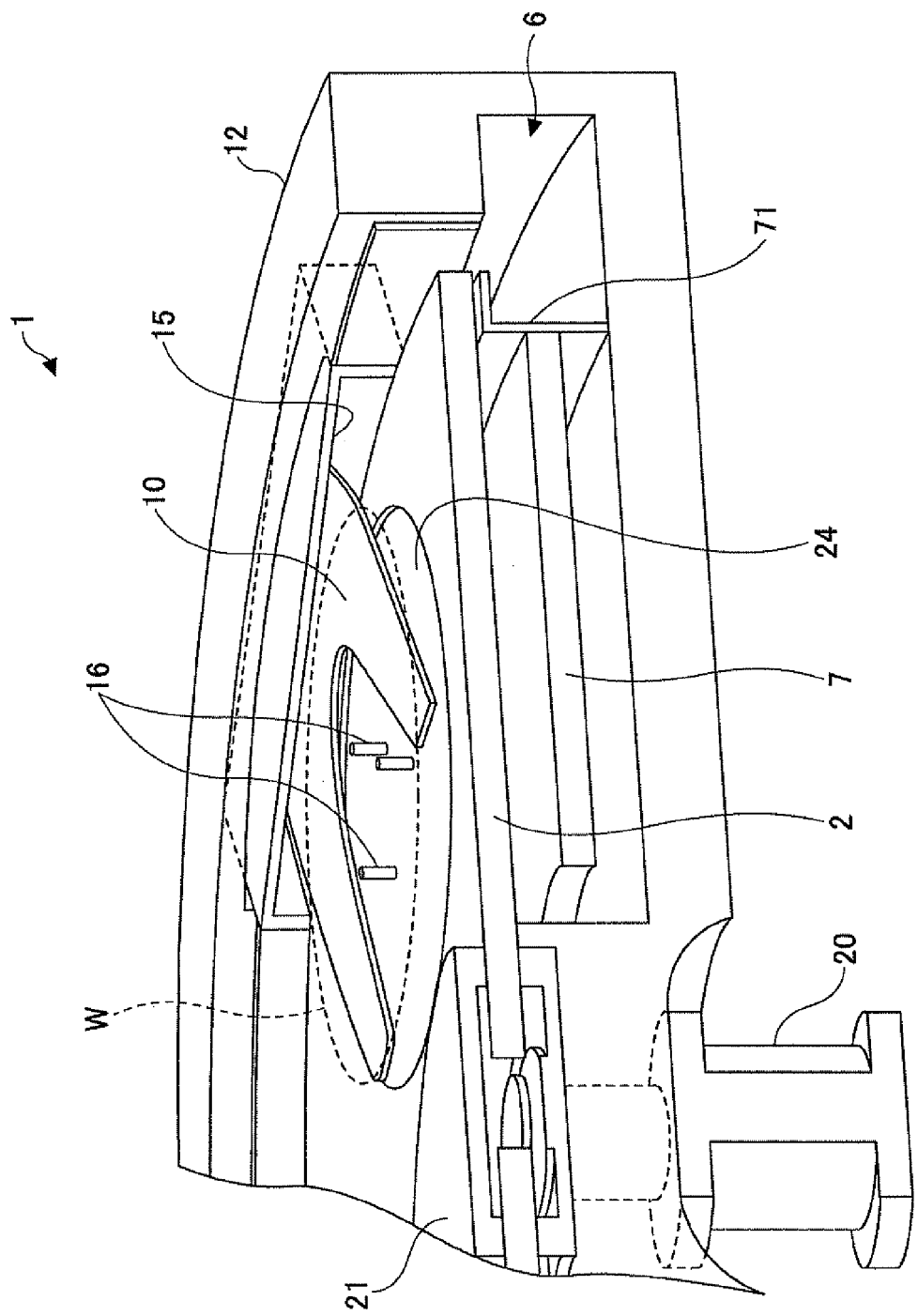
FIG. 5 is a partial cross-sectional view of the film deposition apparatus of FIG. 1.

In addition, a transfer opening 15 through which the wafer W is transferred into or out from the vacuum chamber 1 by a transfer arm 10 is formed in a side wall of the chamber body 12 as shown in FIGS. 2, 3 and 5. The transfer opening 15 is opened or closed by a gate valve (not shown). When the concave portion 24 (substrate receiving area) of the turntable 2 is in alignment with the transfer opening 15 and the gate valve is opened, the wafer W is transferred into the vacuum chamber 1 by the transfer arm 10 and placed in the concave portion 24. In order to lower/raise the wafer W into/from the concave portion 24, there are provided elevation pins 16 (FIG. 5) that are raised or lowered through corresponding through holes formed in the concave portion 24 of the turntable 2 by an elevation mechanism (not shown).

Referring to FIGS. 2 and 3, the vacuum chamber 1 includes a first reaction gas nozzle 31, a second reaction gas nozzle 32, and separation gas nozzles 41, 42 above the turntable 2, all of which extend in radial directions and at predetermined angular intervals. With this configuration, the concave portions 24 can move through and below the nozzles 31, 32, 41, and 42, when the turntable 2 is rotated. The reaction gas nozzles 31, 32 and the separation gas nozzles 41, 42 are attached in a side wall of the vacuum chamber 1 so that corresponding gas inlet ports 31a, 32a, 41a, 42a, which are the base ends of the nozzles 31, 32, 41, 42, penetrate the side wall. In the illustrated example, the second reaction gas nozzle 32, the separation gas nozzle 41, the first reaction gas nozzle 31, and the separation gas nozzle 42 are arranged clockwise in this order. Although the gas nozzles 31, 32, 41, 42 are introduced into the vacuum chamber 1 from the side wall of the vacuum chamber 1 in the illustrated example, these nozzles 31, 32, 41, 42 may be introduced from a ring-shaped protrusion portion 54 (described later). In this case, an L-shaped conduit may be provided in order to be open on the outer circumferential surface of the protrusion portion 54 and on the outer top surface of the ceiling plate 11. With such an L-shaped conduit, the nozzle 31 (32, 41, 42) can be connected to one opening of the L-shaped conduit inside the vacuum chamber 1 and the gas inlet port 31a (32a, 41a, 42a) can be connected to the other opening of the L-shaped conduit outside the vacuum chamber 1.

The first reaction gas nozzle 31 and the second reaction gas nozzle 32 are connected to a gas supplying source (not shown) of bis(tertiary-butylamino)silane (BTBAS), which is a first source gas, and a gas supplying source (not shown) of $O_3$ (ozone) gas, which is a second source gas, respectively. The reaction gas nozzles 31, 32 have plural ejection holes 33 to eject the corresponding source gases downward. The plural ejection holes 33 are arranged in longitudinal directions of the reaction gas nozzles 31, 32 at predetermined intervals. The reaction gas nozzles 31, 32 are a first reaction gas supplying portion and a second reaction gas supplying portion, respectively, in this embodiment. In addition, an area below the reaction gas nozzle 31 is a first process area P1 in which the BTBAS gas is adsorbed on the wafer W, and an area below the reaction gas nozzle 32 is a second process area P2 in which the $O_3$ gas is adsorbed on the wafer W.

Figure 6:
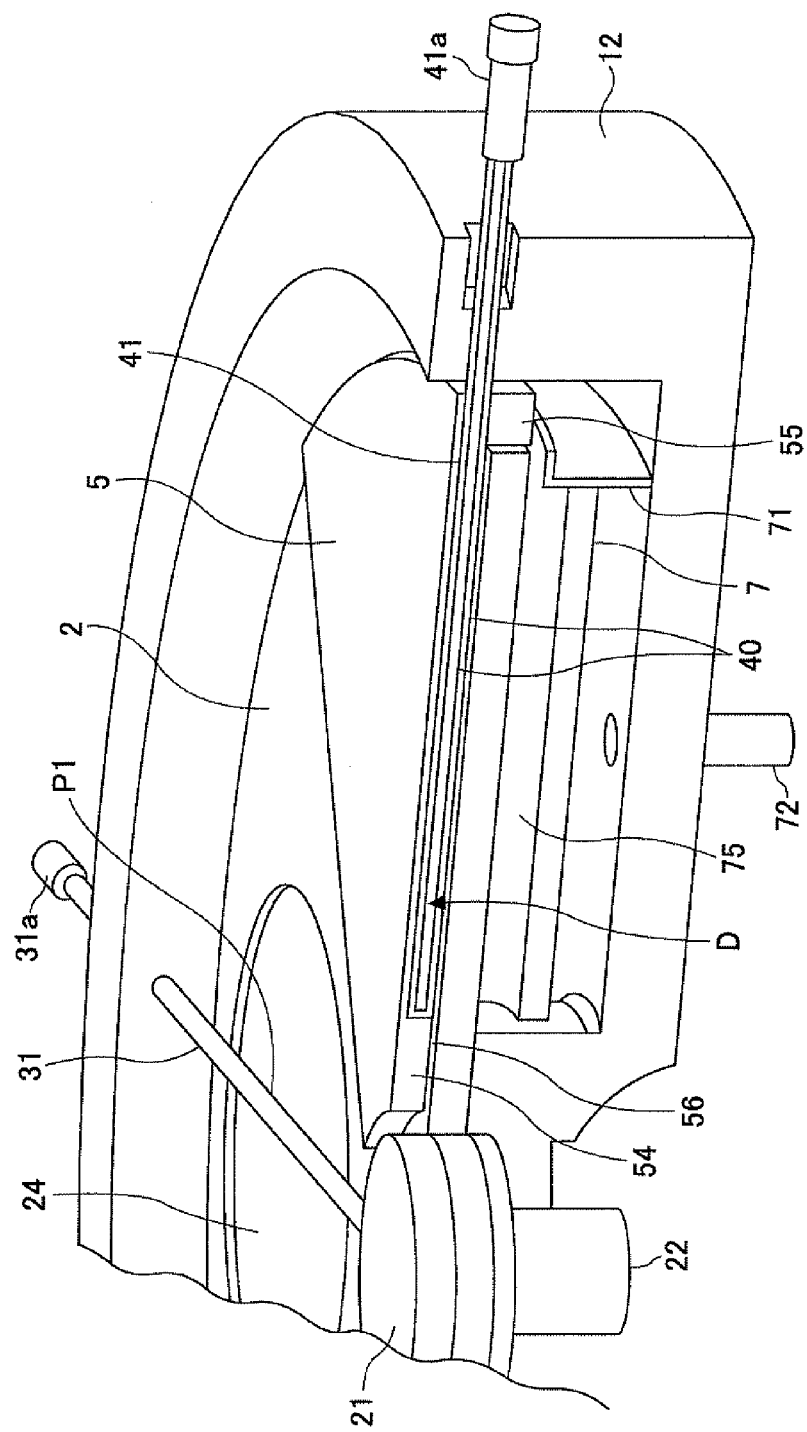
FIG. 6 is a perspective view showing reaction gas nozzles.

The separation gas nozzles 41, 42, which are separation gas supplying portions, have substantially the same configuration of the reaction gas nozzles 31, 32. Namely, the separation gas nozzles 41, 42 have plural ejection holes 40 to eject the separation gases downward from the plural ejection holes 40, and the plural ejection holes 40 are arranged at predetermined intervals in longitudinal directions of the separation gas nozzles 41, 42, as shown in FIGS. 1 and 6. The gas supplying ports 41a, 42a of the corresponding separation gas nozzles 41, 42 are connected to a gas supplying source 43 of $N_2$ (nitrogen) gas (not shown) via gas supplying pipes 41b, 42b. The gas supplying pipes 41b, 42b are provided with heating units 41c, 42c, respectively. A gas manifold 44 including valves, mass flow controllers and the like is provided between the heating units 41c, 42c and the gas supplying source 43. The gas manifold 44 controls supplying/shutting-off of the $N_2$ gas from the gas supplying source 43 in accordance with a control signal from a control unit 100.

Figure 7A:
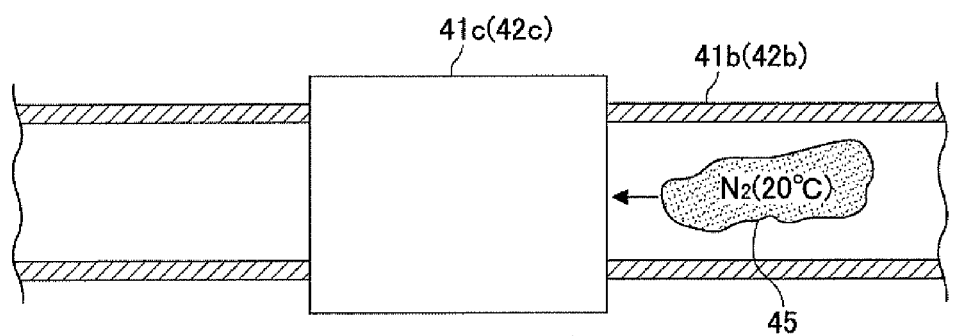
FIG. 7A is an explanatory view for explaining thermal gas expansion by a heating unit of the film deposition apparatus of FIG. 1.
Figure 7B:
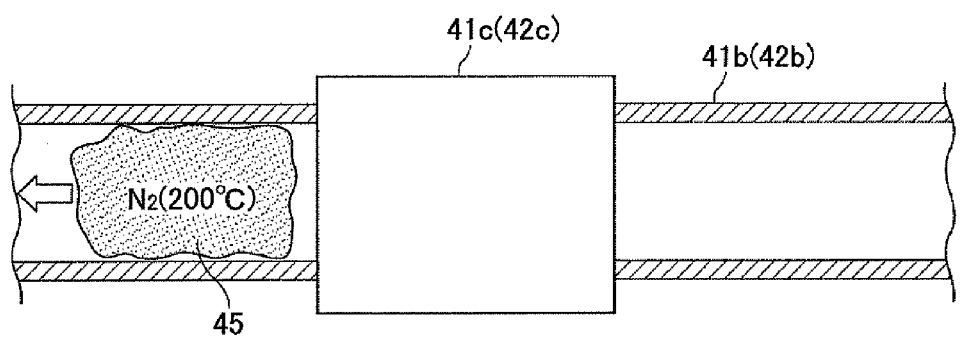
FIG. 7B is another explanatory view for explaining thermal gas expansion by a heating unit of the film deposition apparatus of FIG. 1.

The heating units 41c, 42c include, for example, heaters, and electricity supplied to the heaters is controlled by a controller 100, thereby controlling the temperature of the gas supplying pipes 41b, 42b. With this, the temperature of the $N_2$ gas flowing downstream through the gas supplying pipes 41c, 42c is controlled. Specifically, the heating units 41c, 42c heat the $N_2$ gas up to a temperature that enables the $N_2$ gas supplied from the gas supplying source 43 to thermally expand without influencing the film deposition in the vacuum chamber 1, for example, 200° C. through 300° C. When it is assumed that the temperature of the $N_2$ gas stored in the gas supplying source 43 is 20° C. and the $N_2$ gas is heated to 200° C. by the heating units 41c, 42c, the volume of $N_2$ gas 45 increases 1.61 (=(273+220 (K))/(273+20(K))) times after heated compared with before heated, as shown in FIGS. 7A, 7B, because a volume of gas is linear proportional to an absolute temperature, thereby increasing an apparent flow rate of the $N_2$ gas. With such an increase in the flow rate, the flow speed of the $N_2$ gas is increased accordingly, and the $N_2$ gas is supplied to the vacuum chamber 1 through the separation gas nozzles 41, 42 at an increased flow speed.

The separation gas nozzles 41, 42 are provided in order to form separation areas D that separate the first process area P1 and the second process area P2. As shown in FIGS. 2 through 4, the ceiling plate 11 of the vacuum chamber 1 is provided at areas corresponding to the separation areas D with convex portions 5 having a top view shape of a sector whose apex lies at substantially the center of the vacuum chamber 1 and whose arced periphery lies near and along the inner circumferential wall of the vacuum chamber 1, so that the convex protrusion portions protrude downward.

The separation gas nozzles 41, 42 are housed in grooves 51 that are formed in a radial direction and in the center along a circumferential direction in the corresponding convex portions 5. Namely, distances from a center axis of the separation gas nozzle 41 (42) to sides of the convex portion 5 in both directions are equal. While the groove 51 is formed so that the groove 51 bisects the convex portion 5 in this embodiment, the groove 51 may be formed so that a distance from the center axis of the separation gas nozzle 41 (42) to the side upstream relative to the rotation direction of the turntable 2 becomes longer, for example, in other embodiments.

With such a configuration, lower ceiling surfaces 52 (first ceiling surfaces), which are lower surfaces of the convex portions 5, are formed in both sides of the separation gas nozzles 41, 42, and higher ceiling surfaces 53 (second ceiling surfaces) higher than the lower ceiling surfaces 52 are formed in outer sides of the lower ceiling surfaces 52 along the circumferential directions.

The convex portion 5 forms a separation space, which is a thin space, in order to impede the reaction gases from entering the space between the convex portion 5 and the turntable 2 and from being mixed. Namely, taking an example of the separation gas nozzle 41, this nozzle 41 may impede the $O_3$ gas and the BTBAS gas from entering between the convex portion 5 and the turntable 2 from the upstream side and the downstream side of the rotation direction, respectively. "The gases being impeded from entering" means that the $N_2$ gas as the separation gas ejected from the separation gas nozzle 41 spreads between the first ceiling surfaces 52 and the upper surface of the turntable 2 and flows out to a space below the second ceiling surfaces 53, which are adjacent to the corresponding first ceiling surfaces 52 in the illustrated example, so that the gases cannot enter the separation space from the space below the second ceiling surfaces 53. "The gases cannot enter the separation space" means not only that the gas are completely prevented from entering the separation space, but also that the gases cannot proceed farther toward the separation gas nozzle 41 and thus be mixed with each other even when a fraction of the reaction gases enter the separation space. Namely, as long as such effect is demonstrated, the separation area D is to separate the first process area P1 and the second process area P2. A degree of "thin" of the thin space may be determined so that the effect of "the gases cannot enter the separation space" is demonstrated by a pressure difference caused between the thin space (a space below the convex portion 5) and the adjacent areas (areas below the second ceiling surfaces 53), and the specific height of the thin space may be different depending on the area of the convex portion 5 (the lower ceiling surfaces 52). The BTBAS gas or the $O_3$ gas adsorbed on the wafer W can pass through below the convex portion 5. Therefore, the gases in "the gases being impeded from entering" mean the gases in a gaseous phase.

On the other hand, the ring-shaped protrusion portion 54 is provided on the lower surface of the ceiling plate 11 so that the inner circumference surface of the protrusion portion 54 faces the outer circumference surface of the core portion 21. The protrusion portion 54 opposes the turntable 2 in an outer area of the core portion 21. In addition, a lower surface of the protrusion portion 54 and a lower surface of the convex portion 5 form one plane surface. In other words, a height of the lower surface of the protrusion portion 54 from the turntable 2 is the same as a height of the lower surface of the convex portion 5, which will be referred to as a height h below. The convex portion 5 is formed not integrally with but separately from the protrusion portion 54 in other embodiments. FIGS. 2 and 3 show the inner configuration of the vacuum chamber 1 whose ceiling plate 11 is removed while the convex portions 5 remain inside the vacuum chamber 1.

In this embodiment, the separation gas nozzles 41, 42 and the reaction gas nozzles 31, 32 have plural ejection holes having an inner diameter of, for example, 0.5 mm arranged in longitudinal directions at predetermined intervals of, for example, 10 mm.

In addition, when the wafer W having a diameter of about 300 mm is supposed to be processed in the vacuum chamber 1, the convex portion 5 has a circumferential length (along the circumferential direction from one side to the other side of the convex portion 5) of, for example, about 146 mm along an interfacial position with respect to the protrusion portion 54 at a distance 140 mm from the rotation center of the turntable 2, and a circumferential length of, for example, about 502 mm along an arc corresponding to the widest portion of the concave portion 24 of the turntable 2 in this embodiment. In addition, a circumferential length L from one side wall of the convex portion 5 through the nearest inner wall of the groove 51 along the arc is about 246 mm, as shown in FIG. 4A.

The height h of the lower surface of the convex portion 5, namely, the ceiling surface 52 from the upper surface of the turntable 2 may be 0.5 mm through 10 mm, for example, and is preferably about 4 mm. In this case, the rotation speed of the turntable 2 may be set as, for example, 1 rpm through 500 rpm. In order to allow the separation area D to demonstrate the separation effect, a size of the convex portion 5 and the height h of the lower surface of the convex portion 5 (the first ceiling surface 52) from the turntable 2 may be determined depending on the rotation speed of the turntable 2 and the like, through experimentation.

Figure 8A:
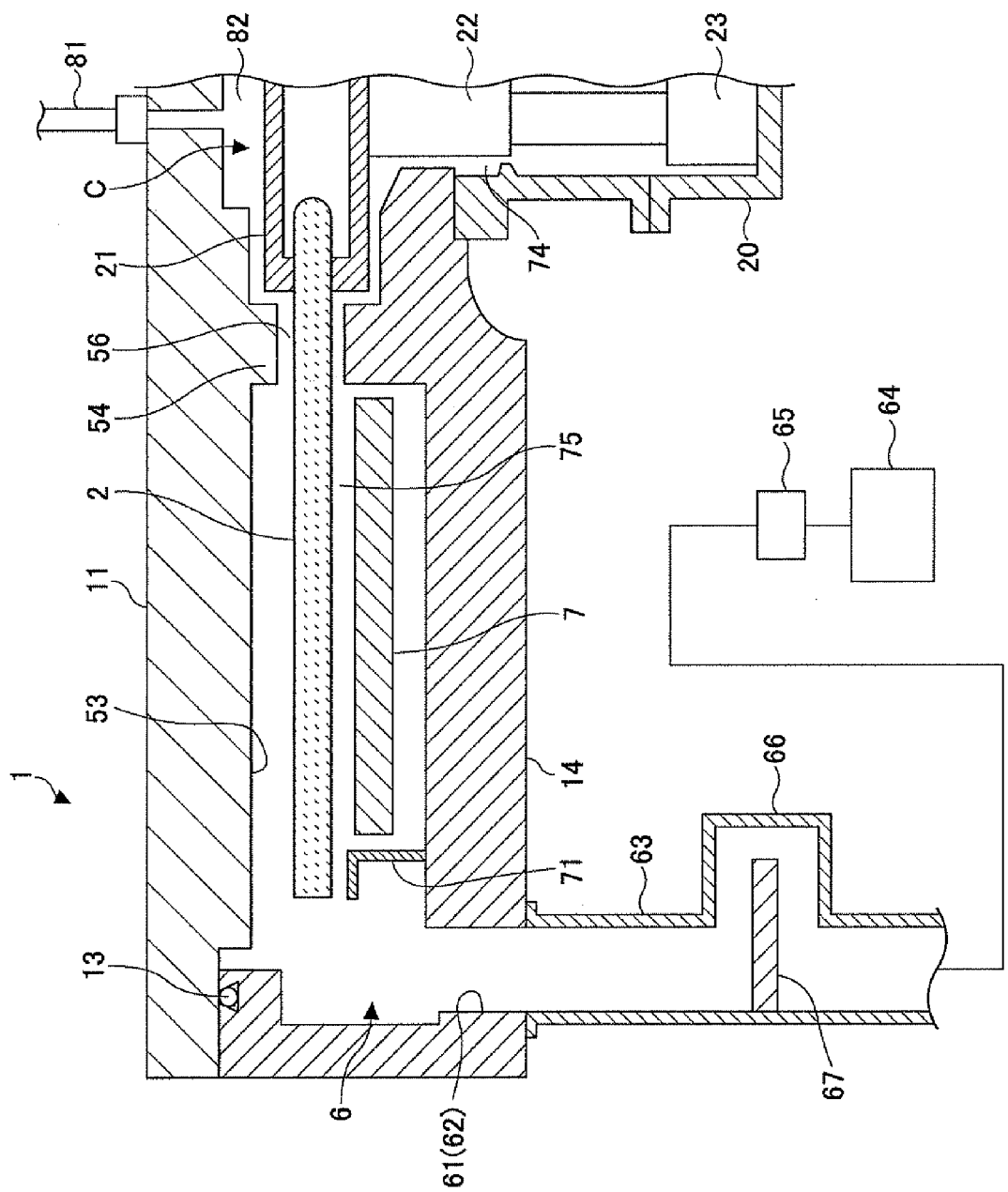
FIG. 8A is a partial cross-sectional view of the film deposition apparatus of FIG. 1.
Figure 8B:
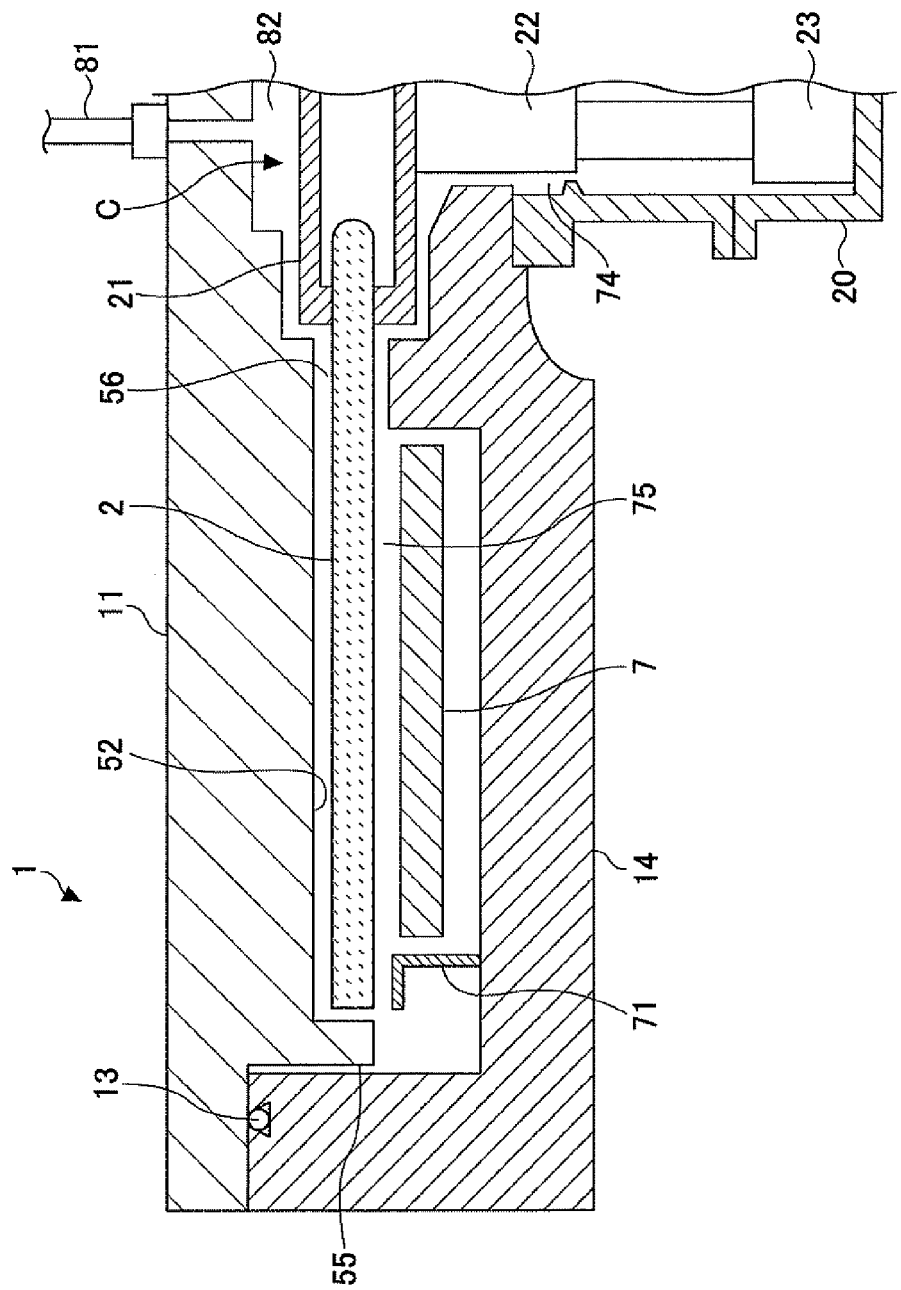
FIG. 8B is another partial cross-sectional view of the film deposition apparatus of FIG. 1.

As described above, the vacuum chamber 1 is provided with the first ceiling surfaces 52 and the second ceiling surfaces 53 higher than the first ceiling surfaces 52, which are alternately arranged in the circumferential direction. FIG. 8A shows a cross section of one portion of the vacuum chamber 1 where the higher ceiling surface 53 is formed, and FIG. 8B shows a cross section of another portion of the vacuum chamber 1 where the lower ceiling surface 52 is formed. As shown in FIGS. 2 and 8B, the convex portion 5 has a bent portion 55 that bends in an L-shape at the outer circumferential edge of the convex portion 5. The bent portion 55 is provided in order to impede the reaction gases from entering from both sides of the bent portion 5 and from being mixed with each other, in the same manner as the protrusion portion 5. The gaps between the bent portion 55 and the turntable 2 and between the bent portion 55 and the chamber body 12 may be the same as the height h of the ceiling surface 52 from the turntable 2. In the illustrated example, a side wall facing the outer circumferential surface of the turntable 2 serves as an inner circumferential wall of the separation area D.

The inner circumferential wall of the chamber body 12 is close to the outer circumferential surface of the bent portion 55 and stands upright in the separation area D, as shown in FIGS. 6 and 8B, and is dented outward from a height corresponding to the outer circumferential surface of the turntable 2 down through the bottom portion 14 of the chamber body 12 in areas other than the separation area D, as shown in FIG. 8A. The dented area is referred to as an evacuation area 6 below.

As shown in FIG. 3, two evacuation ports 61, 62 are provided in the corresponding evacuation areas 6. The evacuation port 61 is arranged between the reaction gas nozzle 31 and the adjacent separation area D downstream relative to the reaction gas nozzle 31 along the rotation direction of the turntable 2 in order to evacuate the BTBAS gas and the $N_2$ gas. The evacuation port 62 is arranged between the reaction gas nozzle 32 and the adjacent separation area D downstream relative to the reaction gas nozzle 32 along the rotation direction of the turntable 2 in order to evacuate the $O_3$ gas and the $N_2$ gas.

The evacuation ports 61, 62 are connected to a commonly-provided evacuation unit 64 including, for example, a vacuum pump via corresponding evacuation pipes 63, as shown in FIGS. 2 and 8A. Reference numeral "65" in the drawings is a pressure control unit provided in a predetermined position of the evacuation pipe 63. As shown in FIG. 8A, a radial expanding portion 66 is provided in the evacuation pipe 63 upstream relative to the pressure control unit 65. The radial expanding portion 66 may be formed by expanding a diameter of the evacuation pipe 63. In the radial expanding portion 66, a plate-like cooling portion 67 is provided so that the cooling portion 67 blocks a part of the inner space of the radial expanding portion 66, and thus gas conductance in the radial expanding portion 66 becomes lower than the gas conductance in the evacuation pipe 63 upstream relative to the radial expanding portion 66. A fluid conduit (not shown) of cooling medium is formed inside the cooling portion 67, and thus gas flowing into the radial expanding portion 66 can be cooled by the cooling medium flowing through the fluid conduit.

Referring to FIGS. 1, 2, and 6, a heater unit 7 is provided between the turntable 2 and the bottom portion 14 of the vacuum chamber 1 in order to heat the turntable 2 and, thus the wafer W on the turntable 2, up to a temperature set by a process recipe, for example, about 350° C. Below the circumferential portion of the turntable 2, a cover member 71 is provided surrounding the heater unit 7 in order to separate an atmosphere in a heater unit housing space 75 where the heater unit 7 is housed and an atmosphere outside of the heater unit housing space 75.

Referring to FIG. 1, part of the bottom portion 14, the part being closer to the rotation center of the turntable 2 than the space where the heater unit 7 is arranged, comes close to the core portion 21 and the center area and around of the turntable 2, thereby leaving a narrow space 74. In addition, there is a small gap between the rotational shaft 22 and an inner surface of the through hole through which the rotational shaft 22 penetrates. The narrow space 74 is in pressure communication with the inside of the case body 20 through the small gap. A purge gas pipe 73 is connected to be open to the narrow space 74, thereby supplying a purge gas, for example, $N_2$ gas. Moreover, plural purge gas supplying pipes 72 are connected to the bottom portion 14 of the chamber body 12 below the heater unit 7 along the circumferential direction in order to purge the heater unit housing space 75 with, for example, $N_2$ gas.

The purge gas supplying pipes 72, 73 are connected to the $N_2$ gas supplying source 43 and provided with corresponding heating units 72c, 73c having the same configuration of the heating units 41c, 42c. The gas manifold 44 is arranged between the gas supplying source 43 and the heating units 72c, 73c.

Figure 9:
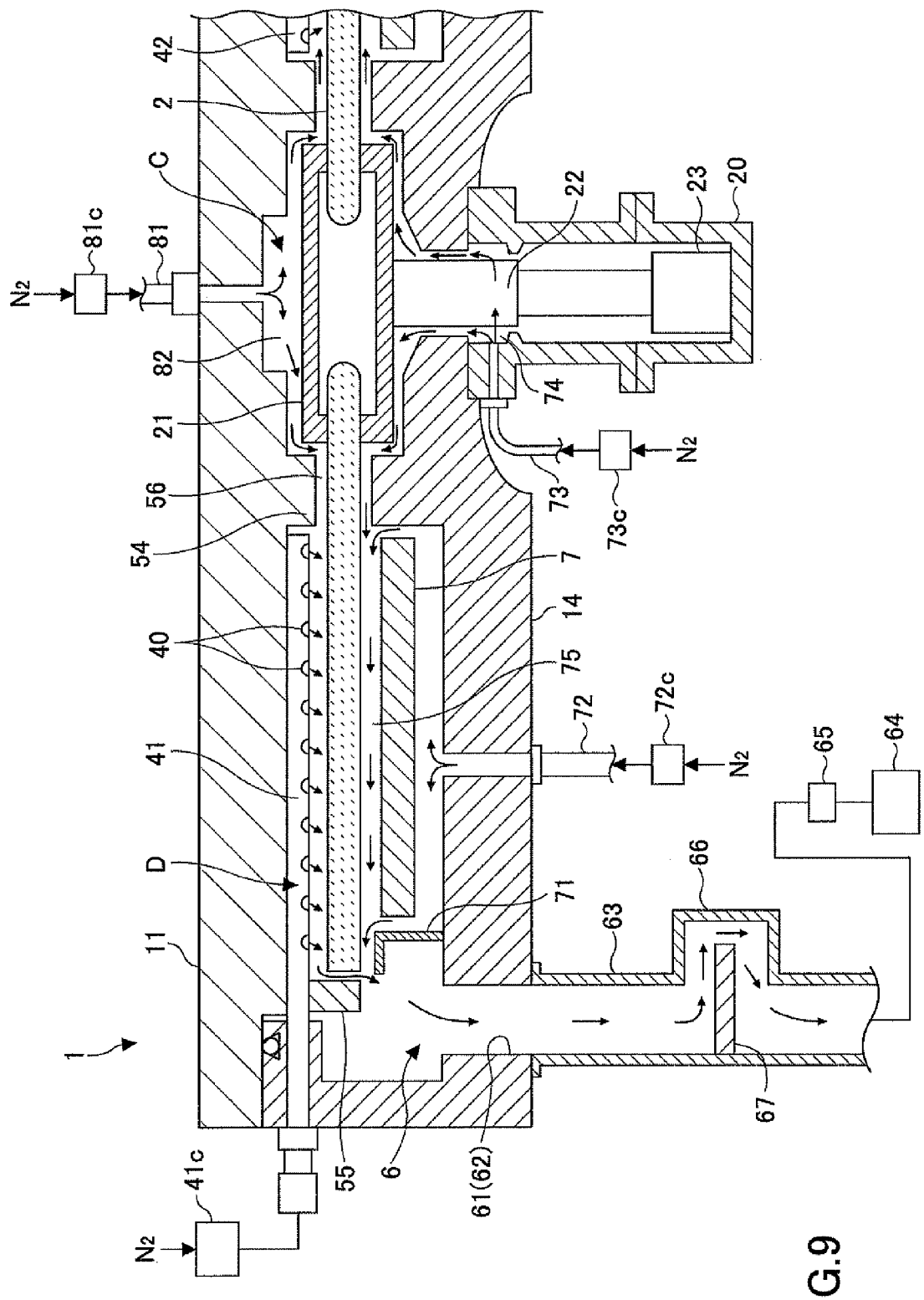
FIG. 9 shows gas flow patterns of purge gases supplied to a vacuum chamber of the film deposition apparatus of FIG. 1.

With the purge gas supplying pipes 72, 73, the space extending from the case body 20 through the heater unit housing space 75 is purged with $N_2$ gas as shown by arrows in FIG. 9. The purge gas is evacuated from the evacuation ports 61, 62 through a gap between the turntable 2 and the cover member 71, and through the evacuation areas 6. With this, the BTBAS ($O_3$) gas does not flow into the second (first) process area P2 (P1) via the space below the turntable 2. Namely, this purge gas serves as another separation gas.

Referring again to FIG. 1, a bottom end of a separation gas supplying pipe 81 is connected to the top center portion of the ceiling plate 11 of the vacuum chamber 1, so that $N_2$ gas is supplied as a separation gas to a space 82 between the ceiling plate 11 and the core portion 21, and an upper end of the separation gas supplying pipe 81 is connected to the gas manifold 44 and the $N_2$ gas supplying source 43. The separation gas supplying pipe 81 has a heating unit 81c having the same configuration of the heating unit 41c.

Referring to FIG. 9, the separation gas supplied to the space 82 flows through the narrow gap 56 between the protrusion portion 54 and the turntable 2 and then along the top surface of the turntable 2, and reaches the evacuation area 6. Because the space 82 and the gap 56 are filled with the $N_2$ gas, the reaction gases (BTBAS, $O_3$) cannot be mixed with each other through the center portion of the turntable 2.

Namely, the film deposition apparatus according to this embodiment is provided with a center area C that is defined by the center portion of the turntable 2 and the vacuum chamber 1 in order to separate the first process area P1 and the second process area P2 and is configured to have an ejection opening that ejects the separation gas toward the top surface of the turntable 2. The ejection opening corresponds to the gap 56 between the protrusion portion 54 and the turntable 2, in the illustrated example.

The heating units 81c, 72c, 73c heat the $N_2$ gas supplied from the gas supplying source 43 in the same manner as the heating units 41c, 42c. The temperature of the $N_2$ gas may be determined to be a temperature so that the $N_2$ gas can thermally expand without influencing the film deposition in the vacuum chamber 1. Specifically, the $N_2$ gas may be heated to 200° C. through 300° C. by the heating units 81c, 72c, 73c. The $N_2$ gas so heated by the heating units 81c, 72, 73c increases its volume and flows into the vacuum chamber 1 at a higher speed, and creates an $N_2$ flow pattern shown in FIG. 9 at the time of the film deposition. The heating units 41c, 42c correspond to first heating units; the heating units 81c corresponds to a second heating unit; and the heating units 72c, 73c correspond to a third heating unit. In FIG. 9, the separation area D and the evacuation ports 61, 62 are illustrated on the same plane in order to better show the $N_2$ flow pattern in the entire vacuum chamber 1. However, the inner wall of the vacuum chamber 1 is not dented outward in an area corresponding to the separation area D (opposing the bent portion 55) as shown in FIG. 8B, and the evacuation ports 61, 62 are misaligned in relation to the separation areas D in the circumferential direction.

Figure 10A:
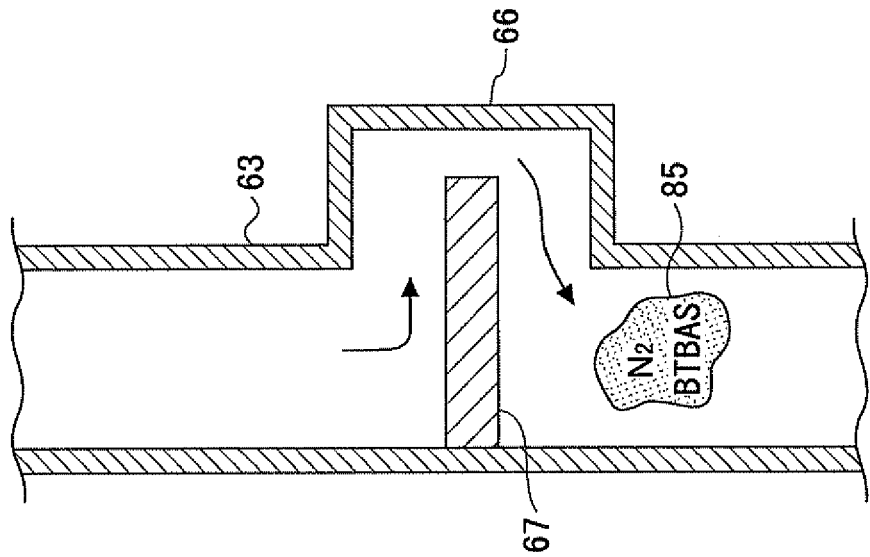
FIG. 10A is an explanatory view for explaining thermal gas contraction in an evacuation pipe of the film deposition apparatus of FIG. 1.
Figure 10B:
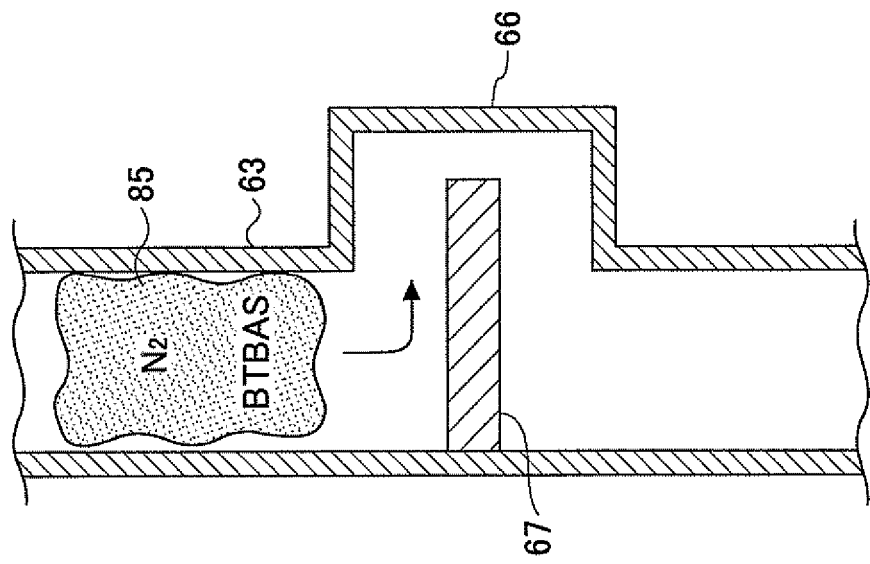
FIG. 10B is another explanatory view for explaining thermal gas contraction in an evacuation pipe of the film deposition apparatus of FIG. 1.

In addition, the $N_2$ gas heated by each heating unit and supplied to the vacuum chamber 1 flows into the evacuation ports 61, 62 along with the BTBAS gas or the $O_3$ gas heated by the heater unit 7 in the vacuum chamber 1. FIGS. 10A and 10B show flow patterns of a mixed gas 85 of the $N_2$ gas and the BTBAS gas flowing through the evacuation pipe 63 connected to the evacuation port 61. As shown, the mix gas 85 is naturally cooled when flowing toward the radial expanding portion 66, and further cooled to lower temperatures of 100° C. through 150° C. when flowing through the radial expanding portion 66. With this, the mixed gas 85 reduces its volume, and further flows downstream to the evacuation unit 64. In the evacuation pipe 63 connected to the evacuation port 62, a mixed gas of the $N_2$ gas and the $O_3$ gas is cooled when flowing through the evacuation pipe 63, further cooled by the cooling portion 67 arranged in the radial expanding portion 66, and evacuated by the evacuation unit 64 (FIG. 9).

The film deposition apparatus according to this embodiment is provided with a controller 100 (FIG. 3) in order to control total operations of the deposition apparatus. The control portion 100 includes a process controller 100a formed of, for example, a computer, a user interface portion 100b, and a memory device 100c. The memory device 100c stores a program for operating the apparatus. The program includes a group of steps for executing an operation of the apparatus described later, and may be installed to the memory device 100c from a storing medium 100d such as a hard disk, a compact disk, a magneto-optical disk, a memory card, a flexible disk, and the like.

Next, a process carried out in the film deposition apparatus according to this embodiment is explained. First, the turntable 2 is rotated and stops so that the concave portion 24 is in alignment with the transfer opening 15 and the gate valve (not shown) is opened. Next, the wafer W is transferred into the vacuum chamber 1 through the transfer opening 15 by the transfer arm 10 (FIG. 5). Then, the elevation pins 16 are moved upward through the corresponding through holes formed in the bottom of the concave portion 24 and receive the wafer W from the transfer arm 10; the transfer arm 10 exits from the vacuum chamber 1; and the elevation pins 16 are moved downward to place the wafer W in the concave portion 24. Such operations are repeated five times so that the five wafers W are placed in the corresponding concave portions 24.

Next, the vacuum chamber 1 is evacuated to a predetermined reduced pressure by the evacuation unit (vacuum pump) 64 and the wafers W are heated by the heating unit 7 while the turntable 2 is being rotated clockwise in this embodiment. Specifically, the turntable 2 is heated in advance to a predetermined temperature by the heating unit 7, and the wafers W are heated when being placed on the turntable 2 (the concave portions 24). In addition, the heaters in the heating units 41c, 42c, 72c, 73c and 81c are heated in order to heat the $N_2$ gas to a predetermined temperature, for example, 200° C. Moreover, the cooling portion 67 of the evacuation pipe 63 is cooled by allowing the temperature-controlled cooling medium to flow through the cooling portion 67 in order to cool the evacuation gas flowing from the vacuum chamber 1.

After the temperatures of the heating units 41c, 42c, 72c, 73c and 81c reach the predetermined temperature, the temperature of the cooling portion 67 reaches the predetermined temperature, and the temperature of the wafers W is confirmed to be the predetermined temperature by a temperature sensor (not shown), the $N_2$ gas is supplied to each gas supplying pipe. The $N_2$ gas is heated by the heating units 41c, 42c, 72c, 73c and 81c, gains its volume and a flow speed, and is supplied to the vacuum chamber 1 from the each supplying pipe and the separation gas nozzles 41, 42. A flow rate of the $N_2$ gas from the separation gas nozzles 41, 42 is, for example, 20000 sccm, and a flow rate of the $N_2$ gas from the separation gas supplying pipe 81 at the center of the vacuum chamber 1 is, for example, 5000 sccm. In addition, a flow rate of the $N_2$ gas from the purge gas supplying pipe 73 open toward the rotational shaft 22 is, for example, 1000 sccm, and a flow rate of the $N_2$ gas from the purge gas supplying pipe 73 open below the heating unit 7 is, for example, 10000 sccm. While the $N_2$ gas is supplied in such flow rates, the BTBAS gas is supplied from the first reaction gas nozzle 31 at a flow rate of 100 sccm, and the $O_3$ gas is supplied from the second reaction gas nozzle 32 at a flow rate of 10000 sccm. Under such flow rate conditions, a process pressure in the vacuum chamber 1 may be 1067 Pa (8 Torr).

Because the wafers W move alternately through the first process area P1 where the first reaction gas nozzle 31 is arranged and the second process area P2 where the second reaction gas nozzle 32 is arranged by the rotation of the turntable 2, the BTBAS gas is adsorbed on the surfaces of the wafers W and then the $O_3$ gas is adsorbed on the surfaces of the wafers W, thereby oxidizing the BTBAS molecules to form a mono-layer or plural layers of silicon oxide. In such a manner, molecular layers of silicon oxide are accumulatively deposited, and thus the silicon oxide film having a predetermined thickness is formed on the wafers W after predetermined rotations of the turntable 2.

In the illustrated example, the inner circumferential wall of the chamber body 12 is dented outward in portions corresponding to the spaces below the second ceiling surfaces 53 (or, the process areas P1, P2 where the reaction gas nozzles 31, 32 are arranged, respectively), leaving a larger space above the evacuation ports 61, 62. Therefore, the pressure in the spaces below the second ceiling surfaces 53 is lower than the pressures in the thin space below the first ceiling surface 52 and the center area C.

Figure 11:
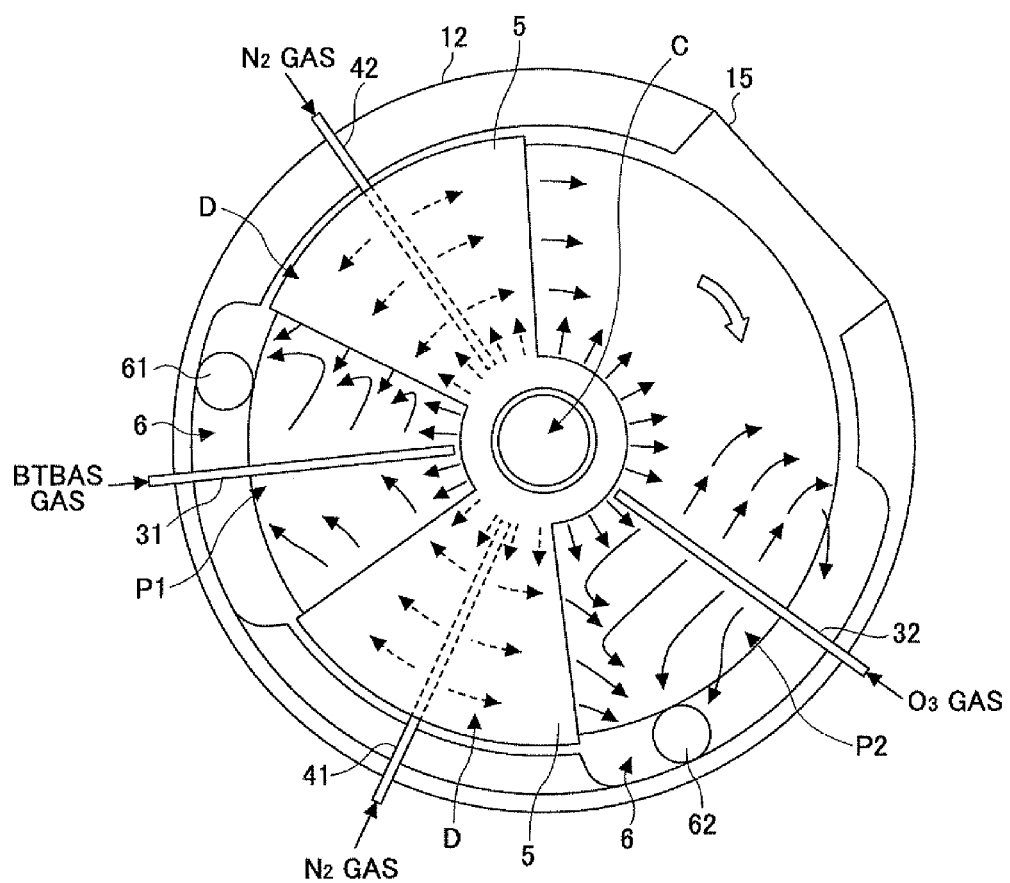
FIG. 11 shows a gas flow pattern in the vacuum chamber of the film deposition apparatus of FIG. 1.

FIG. 11 schematically shows the flow patterns of the gases in the vacuum chamber 1 when the gases are supplied from the gas nozzles, the gas supplying pipes and the like to the vacuum chamber 1. Part of the $O_3$ gas ejected from the second reaction gas nozzle 32 hits and flows along the top surface of the turntable 2 (and the surface of the wafer W) in a direction opposite to the rotation direction of the turntable 2. Then, the $O_3$ gas is pushed back by the $N_2$ gas flowing along the rotation direction, and changes the flow direction toward the edge of the turntable 2 and the inner circumferential wall of the chamber body 12. Finally, this part of the $O_3$ gas flows into the evacuation area 6 and is evacuated from the vacuum chamber 1 through the evacuation port 62.

Another part of the $O_3$ gas ejected from the second reaction gas nozzle 32 hits and flows along the top surface of the turntable 2 (and the surface of the wafers W) in the same direction as the rotation direction of the turntable 2. This part of the $O_3$ gas mainly flows toward the evacuation area 6 due to the $N_2$ gas flowing from the center portion C and suction force through the evacuation port 62. On the other hand, a small portion of this part of the $O_3$ gas flows toward the separation area D located downstream of the rotation direction of the turntable 2 in relation to the second reaction gas nozzle 32 and may enter the gap between the ceiling surface 52 and the turntable 2. However, because the height h and the circumferential length of the gap are designed so that the $O_3$ gas is impeded from flowing into the gap at film deposition conditions intended, the small portion of the $O_3$ gas cannot flow into the gap below the convex portion 5. Even when a small fraction of the $O_3$ gas flows into the gap, the fraction of the $O_3$ gas cannot flow farther into the separation area D, because the fraction of the $O_3$ gas is pushed backward by the $N_2$ gas ejected from the separation gas nozzle 41. Then, substantially all the part of the $O_3$ gas flowing along the top surface of the turntable 2 in the rotation direction flows into the evacuation area 6 through between the circumference of the turntable 2 and the inner circumferential wall of the vacuum chamber 1, and is evacuated through the evacuation port 62 along with the $N_2$ gas ejected from the center area C, as shown in FIG. 11.

Similarly, the BTBAS gas ejected from the first reaction gas nozzle 31 to flow along the top surface of the turntable 2 (and the surface of the wafers W) in the rotation direction of the turntable 2 and the opposite direction cannot flow into the gaps below the convex portions 5 located upstream and downstream of the rotation direction, respectively. Alternatively, even when a fraction of the BTBAS gas enters the gaps, the fraction of the BTBAS gas is pushed backward to the process areas P1, P2. Then, the BTBAS gas flows into the evacuation area 6 between the circumference of the turntable 2 and the inner circumferential wall of the vacuum chamber 1, and is evacuated through the evacuation port 61 along with the $N_2$ gas ejected from the center area C.

As stated above, the separation areas D may prevent the BTBAS gas and the $O_3$ gas from flowing thereinto, or may greatly reduce the amount of the BTBAS gas and the $O_3$ gas flowing thereinto, or may push the BTBAS gas and the $O_3$ gas backward. On the other hand, the BTBAS molecules and the $O_3$ molecules adsorbed on the wafer W are allowed to go through the separation area D (below the lower ceiling surface 52), contributing to the film deposition.

Additionally, the BTBAS gas in the first process area P1 (the $O_3$ gas in the second process area P2) is impeded from flowing into the center area C, because the separation gas is ejected toward the outer circumferential edge of the turntable 2 from the center area C, as shown in FIGS. 7 and 9. Even if a fraction of the BTBAS gas in the first process area P1 (the $O_3$ gas in the second process area P2) flows into the center area C, the BTBAS gas (the $O_3$ gas) is pushed backward, so that the BTBAS gas in the first process area P1 (the $O_3$ gas in the second process area P2) is impeded from flowing into the second process area P2 (the first process area P1) through the center area C.

Moreover, the BTBAS gas in the first process area P1 (the $O_3$ gas in the second process area P2) is impeded from flowing into the second process area P2 (the first process area P1) through the space between the turntable 2 and the inner circumferential wall of the chamber body 12. This is because the bent portion 55 is formed downward from the convex portion 5 so that the gaps between the bent portion 55 and the turntable 2 and between the bent portion 55 and the inner circumferential wall of the chamber body 12 are as small as the height h of the ceiling surface 52 of the convex portion 5, thereby substantially avoiding pressure communication between the two process areas, as stated above. Therefore, the two separation areas D separate the first process area P1 and the second process area P2.

In addition, the space below the turntable 2 is purged with the $N_2$ gas supplied from the purge gas supplying pipes 72, 73, as shown in FIG. 9. Therefore, the BTBAS gas cannot flow through below the turntable 2 into the second process area P2. Namely, the BTBAS gas flows into the evacuation port 61 along with the $N_2$ gas, and the $O_3$ gas flows into the evacuation port 62 along with the $N_2$ gas. The gases flowing into the evacuation pipes 63 through the evacuation ports 61, 62 are cooled by the cooling portions 67, reduce their volume, and are evacuated through the evacuation pipes 63.

After the wafers W pass through the process areas P1, P2 plural times, for example, 600 times, which may be determined based on a target film thickness, and a film having the target thickness is deposited on the wafers W, the film deposition process is completed. Then, the wafers W are transferred out from the vacuum chamber 1 by the elevation pins 16 and the transfer arm 10 in an opposite manner to that described above.

In the film deposition apparatus according to this embodiment, the ceiling surfaces 52 (the convex portions 5) opposing the turntable 2 on which the wafers W are placed and the separation gas nozzles 41, 42 that supply the $N_2$ gas between the ceiling surfaces 52 and the turntable 2 are provided in the separation area D located between the first process area P1 where the BTBAS gas is supplied and the second process area P2 where the $O_3$ gas is supplied. The gas supplying pipes 41b, 42b that supply the $N_2$ gas to the separation gas nozzles 41, 42 are provided with the heating units 41c, 42, respectively, and thus the $N_2$ gas supplied to the separation gas nozzles 41, 42 is heated by the heating units 41c, 42c. Because the $N_2$ gas thermally expands by being heated by the heating units 41c, 42c, and is supplied to the separation area D from the separation gas nozzles 41, 42 at a higher flow speed, an amount of the $N_2$ gas used can be reduced (or, an increase in $N_2$ gas consumption is avoided). In addition, the gas mixture of the BTBAS gas and the $O_3$ gas is avoided, thereby enabling an ALD (MLD) mode film deposition. While the turntable 2 has five concave portions 24 in this embodiment, the turntable 2 may have only one concave portion 24.

Moreover, the $N_2$ gas as the separation gas is supplied to the space 82 between the core portion 21 and the ceiling plate 11 of the vacuum chamber 1 in order to avoid the gas mixture of the reaction gases in the film deposition apparatus according to this embodiment, and the $N_2$ gas flows toward the top surface of the turntable 2 from the space 82. This $N_2$ gas can be heated by the heating unit 81c and thermally expanded. Therefore, because the $N_2$ gas can flow into the space 82 at a higher flow speed, an amount of the $N_2$ gas supplied to the space 82 can be reduced.

Furthermore, because the $N_2$ flowing through the gas supplying pipes 72, 73 can be heated by the heating units 72c, 73c and the heated $N_2$ gas is supplied to the space below the turntable 2 at a higher flow speed. Therefore, an amount of the $N_2$ gas supplied from the gas supplying pipes 72, 73 can be reduced.

In addition, because the gas flowing through the evacuation pipe 63 is cooled by the cooling portion 67 and reduces its volume, an amount of the gas evacuated by the evacuation unit 64 can be reduced, thereby reducing a load of the evacuation unit 64 and saving electricity supplied to the evacuation unit 64. The cooling portion 67 is provided in the radial expanding portion 66 of the evacuation pipe 63 in order to reduce the gas conductance. Therefore, the gas flow speed is reduced by the cooling portion 67, and thus the cooling efficiency is improved, thereby further reducing the volume of the gas flowing through the evacuation pipe 63.

While the heating units are provided in the corresponding gas supplying pipes for supplying the $N_2$ gas to the vacuum chamber 1 in this embodiment, a gas reservoir 49 that temporarily retains the $N_2$ gas from the $N_2$ gas supplying source 43 and heats the $N_2$ gas to a predetermined temperature may be provided and the heated $N_2$ gas may be supplied from the gas reservoir 49 to the vacuum chamber 1 through the gas manifold 44 and the corresponding gas supplying pipes, in other embodiments, as shown in FIG. 12.

In addition, the convex portion 5 (the ceiling surface 52) preferably has a greater width (a longer arc) toward the circumference in the upstream side of the convex portion 5. This is because the gas flowing downstream along the rotation direction of the turntable 2 has a higher speed in the position closer to the circumference of the turntable 2. In view of this, it is preferable for the convex portion 5 to have a sector-shaped top view.

Figure 13A:
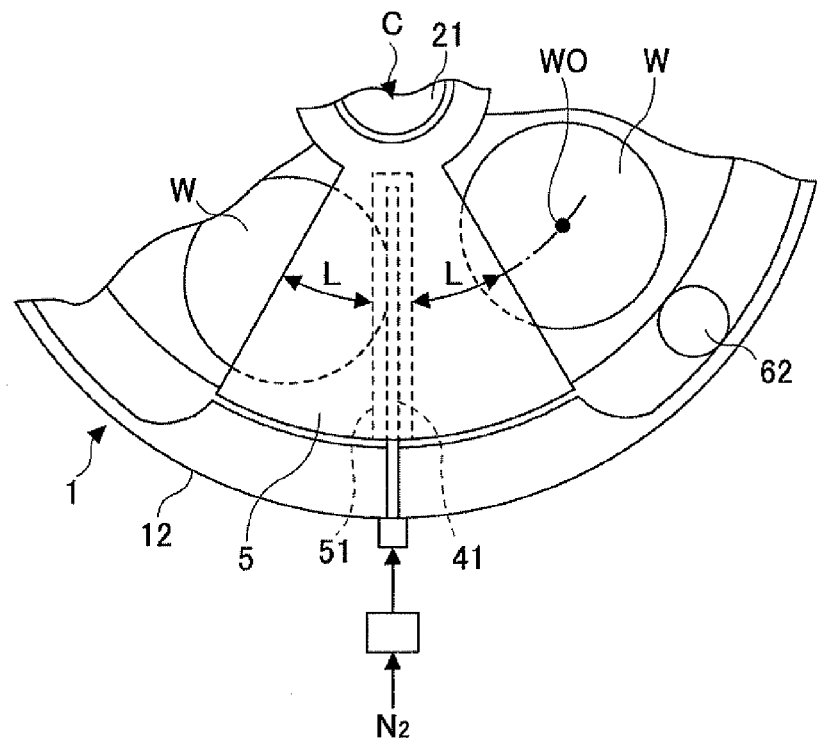
FIGS. 13A and 13B are explanatory views of a convex portion used in a separation area in a vacuum chamber of the film deposition apparatus according to an embodiment of the present invention.
Figure 13B:
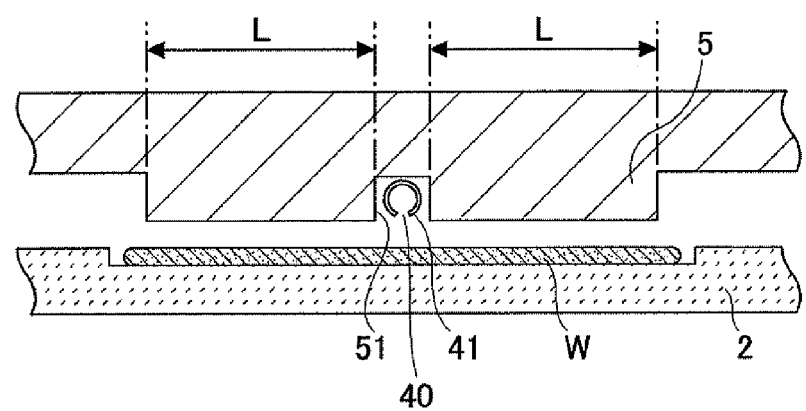

As shown in FIGS. 13A and 13B, the ceiling surface 52 that creates the thin space in both sides of the separation gas nozzle 41 (42) may preferably have a length L of about 50 mm or more when the wafer W has a diameter of 300 mm. Specifically, the length L is preferably from about one-tenth of a diameter of the wafer W through about a diameter of the wafer W, preferably, about one-sixth or more of the diameter of the wafer W along an arc that corresponds to a route through which a wafer center WO passes. When the length L is set to be small, the height h of the ceiling surface 52 from the turntable 2 needs to be small accordingly in order to efficiently impede the reaction gases from entering the thin space below the ceiling surface 52 from both sides of the convex portion 5.

Moreover, when the height h of the ceiling surface 52 from the turntable 2 is set to a certain value, the length L has to be larger in the position closer to the circumference of the turntable 2 in order to efficiently impede the reaction gases from entering the thin space below the ceiling surface 52 because a linear speed of the turntable 2 becomes higher in the position further away from the rotation center. When considered from this viewpoint, when the length L measured along the route through which a wafer center WO passes is smaller than 50 mm, the height h of the thin space needs to be significantly small. Therefore, measures to damp vibration of the turntable 2 are required in order to prevent the turntable 2 or the wafer W hitting the ceiling surface 52 when the turntable 2 is rotated.

Furthermore, when the rotation speed of the turntable 2 is higher, the reaction gas tends to enter the space below the convex portion 5 from the upstream side of the convex portion 5. Therefore, when the length L is smaller than 50 mm, the rotation speed of the turntable 2 needs to be reduced, which is inadvisable in terms of throughput. Therefore, the length L is preferably 50 mm or more, while the length L smaller than 50 mm can demonstrate the effect explained above depending on the situation.

Although the two evacuation ports 61, 62 are made in the chamber body 12 in this embodiment, three evacuation ports may be provided in other embodiments. For example, an additional evacuation port may be made in an area between the second reaction gas nozzle 32 and the separation area D located upstream relative to the clockwise rotation of the turntable 2 in relation to the second reaction gas nozzle 32. In addition, a further additional evacuation port may be made in a predetermined position of the chamber body 12. While the evacuation ports 61, 62 are located below the turntable 2 to evacuate the vacuum chamber 1 through an area between the inner circumferential wall of the chamber body 12 and the outer circumferential surface of the turntable 2 in the illustrated example, the evacuation ports may be located in the side wall of the chamber body 12. In addition, when the evacuation ports 61, 62 are provided in the side wall of the chamber body 12, the evacuation ports 61, 62 may be located higher than the turntable 2. In this case, the gases flow along the upper surface of the turntable 2 into the evacuation ports 61, 62 located higher than the turntable 2. Therefore, it is advantageous in that particles in the vacuum chamber 1 are not blown upward by the gases, compared to when the evacuation ports are provided, for example, in the ceiling plate 11.

Figure 14:
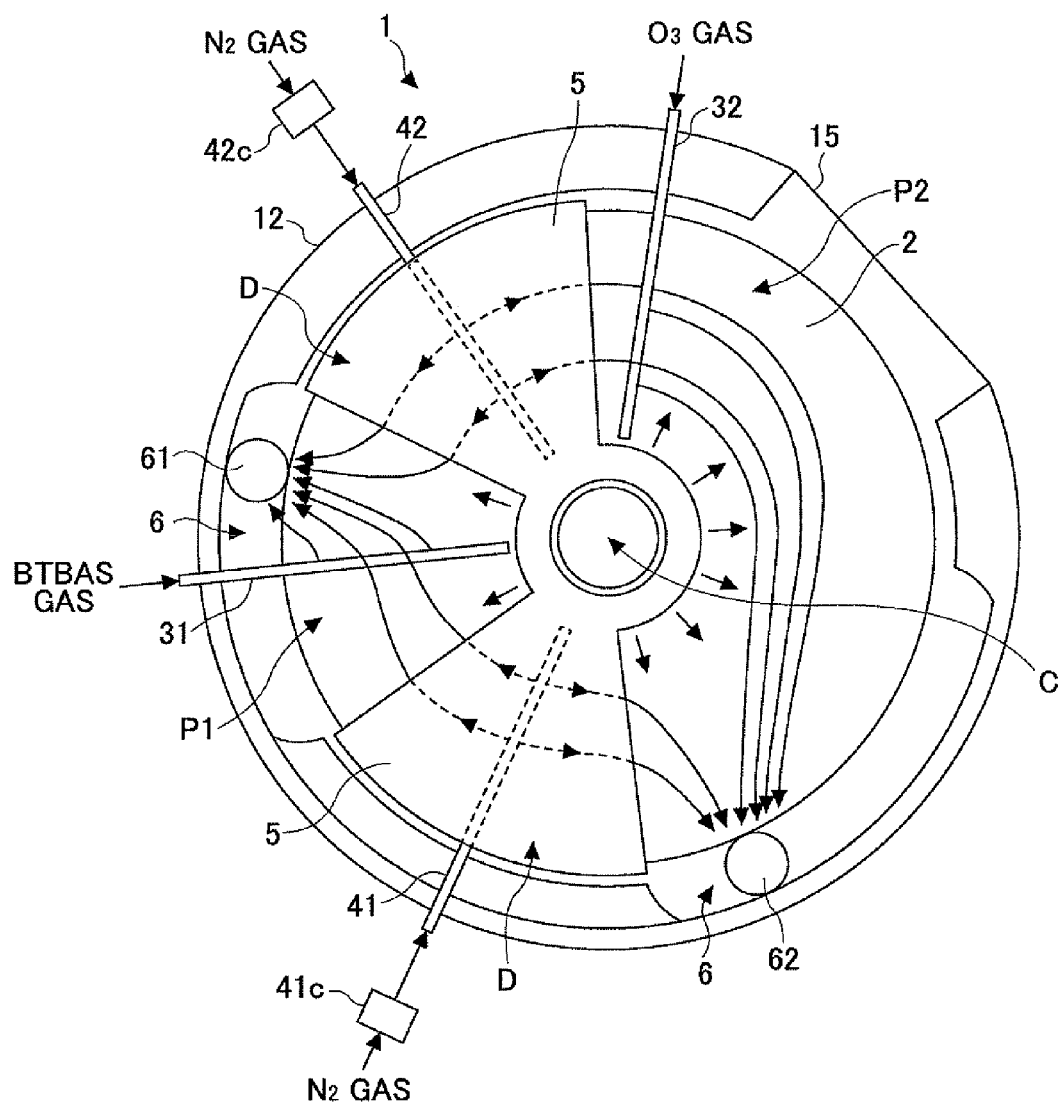
FIG. 14 is a plan view of a film deposition apparatus according to another embodiment of the present invention.

Next, another example of an arrangement of the process areas P1, P2 and the separation area D is explained. FIG. 14 shows an example where the second reaction gas nozzle 32 is located upstream relative to the clockwise rotation of the turntable 2 in relation to the second reaction gas nozzle 32. Even such an arrangement can demonstrate the same effect as explained above.

Figure 15:
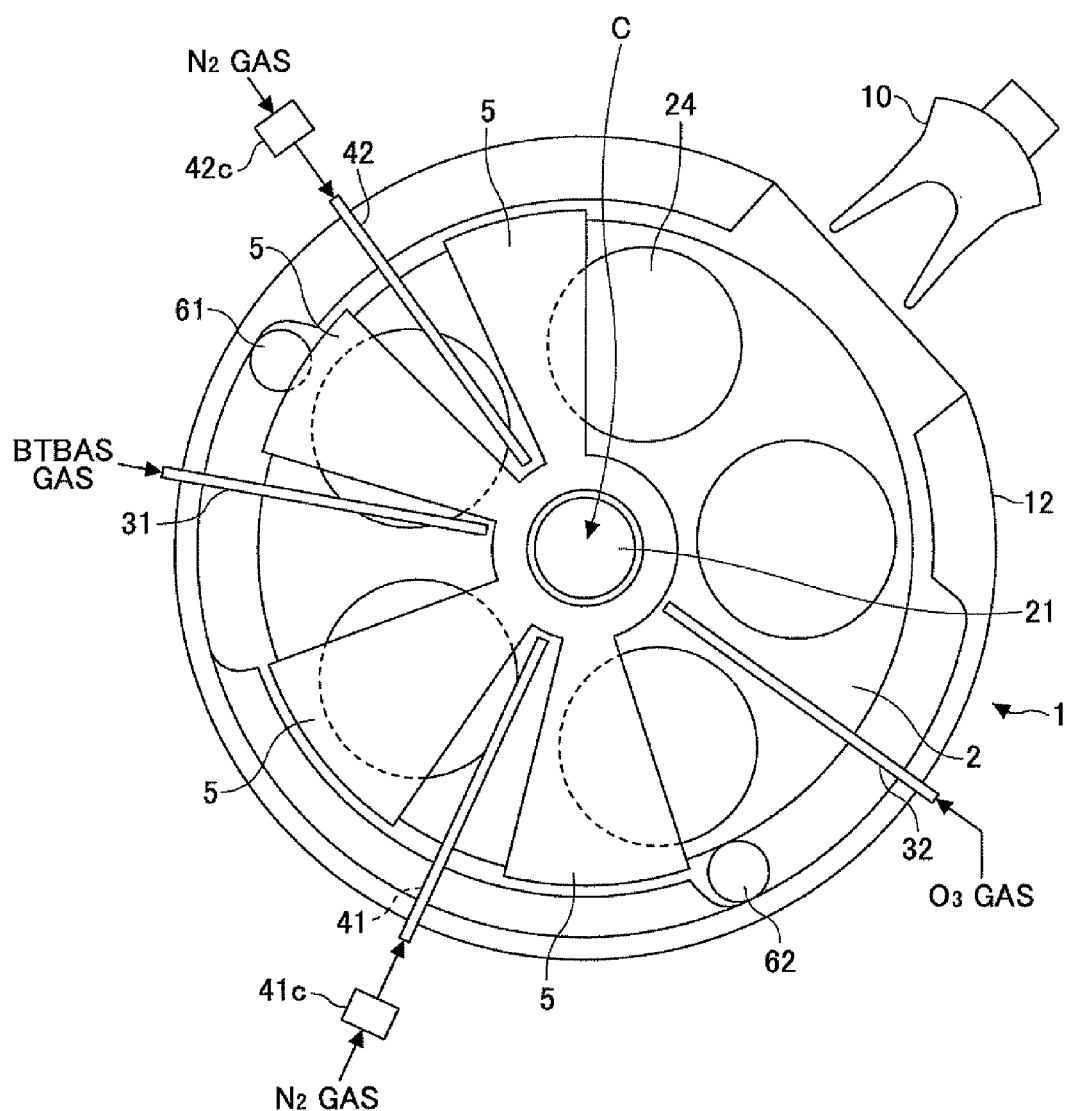
FIG. 15 is a plan view of a film deposition apparatus according to another embodiment of the present invention.

In addition, the separation area D may be configured by attaching two sector-shaped plates on the lower surface of the ceiling plate 11 so that the two sector-shaped plates are located on both sides of the separation gas nozzle 41 (42). FIG. 15 is a plan view illustrating such a configuration. In this case, the size of the convex portion 5 and the distance between the convex portion 5 (the two sector-shaped plates) and the separation gas nozzle 41 (42) can be determined taking into consideration ejection rates of the separation gas and the reaction gas in order to effectively demonstrate the separation effect of the separation area D.

Figure 16:
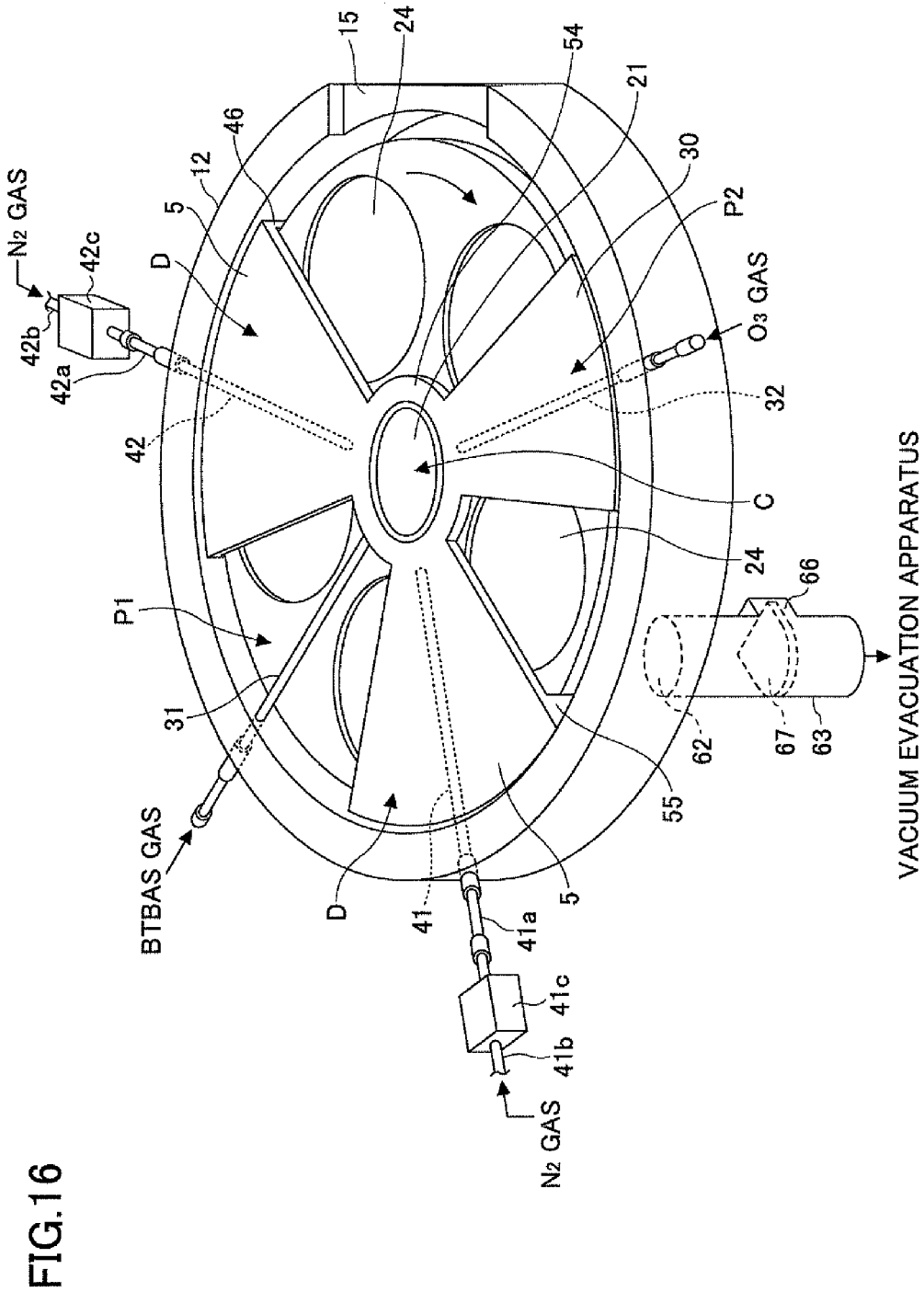
FIG. 16 is a perspective view of another film deposition apparatus according to another embodiment of the present invention.

In the above embodiment, the first process area P1 and the second process area P2 correspond to the areas having the ceiling surface 53 higher than the ceiling surface 52 of the separation area D. However, at least one of the first process area P1 and the second process area P2 may have another ceiling surface that opposes the turntable 2 in both sides of the reaction gas nozzle 31 (32) and is lower than the ceiling surface 53 in order to impede gas from flowing into a gap between the ceiling surface concerned and the turntable 2. This ceiling surface, which is lower than the ceiling surface 53, may be as low as the ceiling surface 52 of the separation area D. FIG. 16 shows an example of such a configuration. As shown, a sector-shaped convex portion 30 is located in the second process area P2, where $O_3$ gas is adsorbed on the wafer W, and the reaction gas nozzle 32 is located in the groove portion (not shown) formed in the convex portion 30. In other words, this second process area P2 shown in FIG. 16 is configured in the same manner as the separation area D, while the gas nozzle is used in order to supply the reaction gas.

Figure 17:
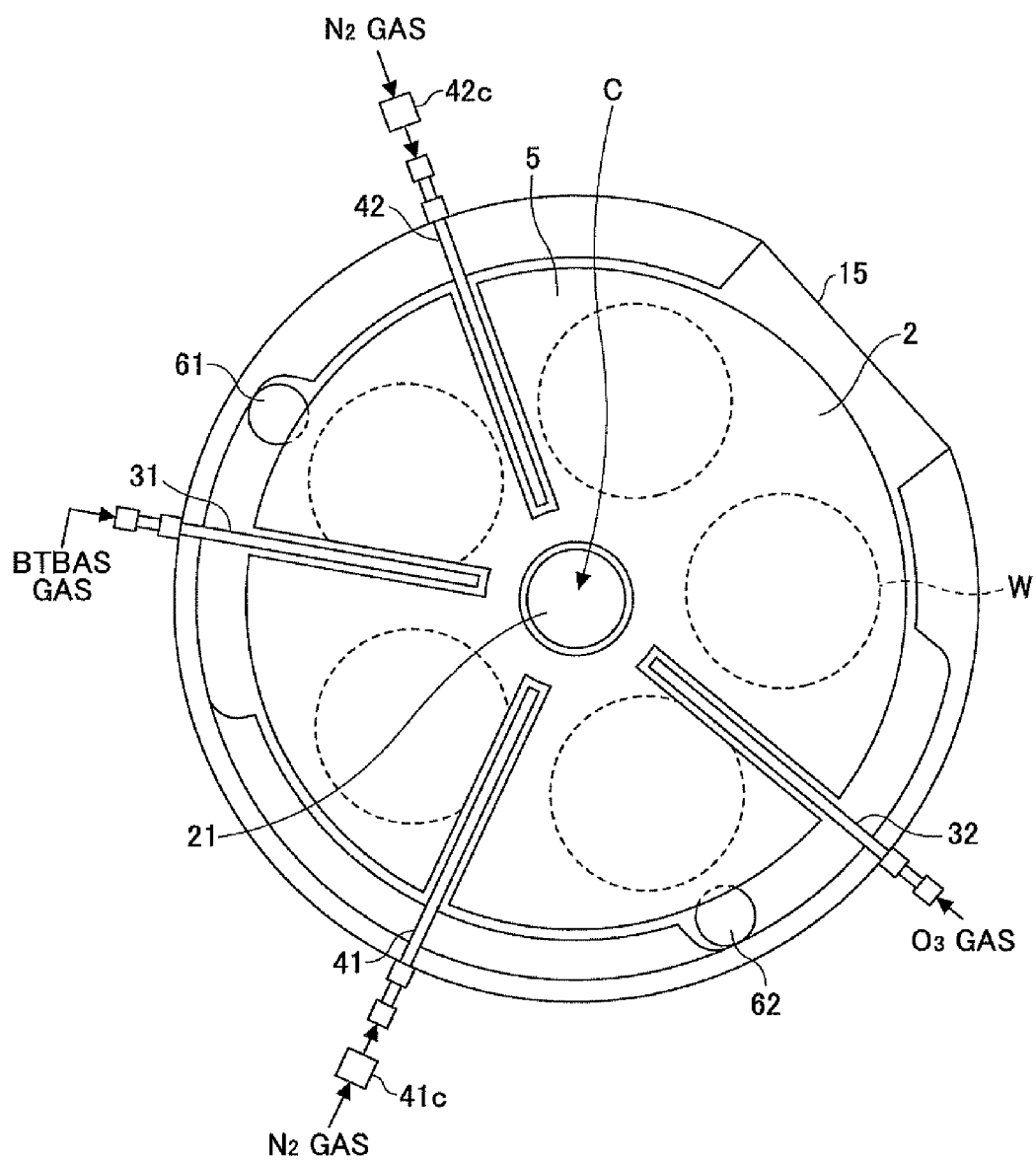
FIG. 17 is a plan view of another film deposition apparatus according to another embodiment of the present invention.

Moreover, low ceiling surfaces may be provided on both sides of the reaction gas nozzle 31 (32) so that these ceiling surfaces are extended to reach the first ceiling surfaces 52, as shown in FIG. 17. In other words, the convex portion 5 may be extended substantially entirely to oppose the turntable 2 except for positions where the separation gas nozzles 41 (42) and the reaction gas nozzles 31 (32) are provided. Even in such a configuration, the same separation effect can be demonstrated. From another viewpoint, the first ceiling surface 52 located on both sides of the separation gas nozzle 41 (42) is extended to the reaction gas nozzle 31 (32). In this case, the separation gas spreads on both sides of the separation gas nozzle 41 (42) and the reaction gas spreads on both sides of the reaction gas nozzle 31 (32). Then, the separation gas and the reaction gas flow into each other below the convex portion 5 (in the thin space) and are evacuated through the evacuation port 61 (62) located between the separation gas nozzle 31 (32) and the reaction gas nozzle 42 (41).

Figure 18:
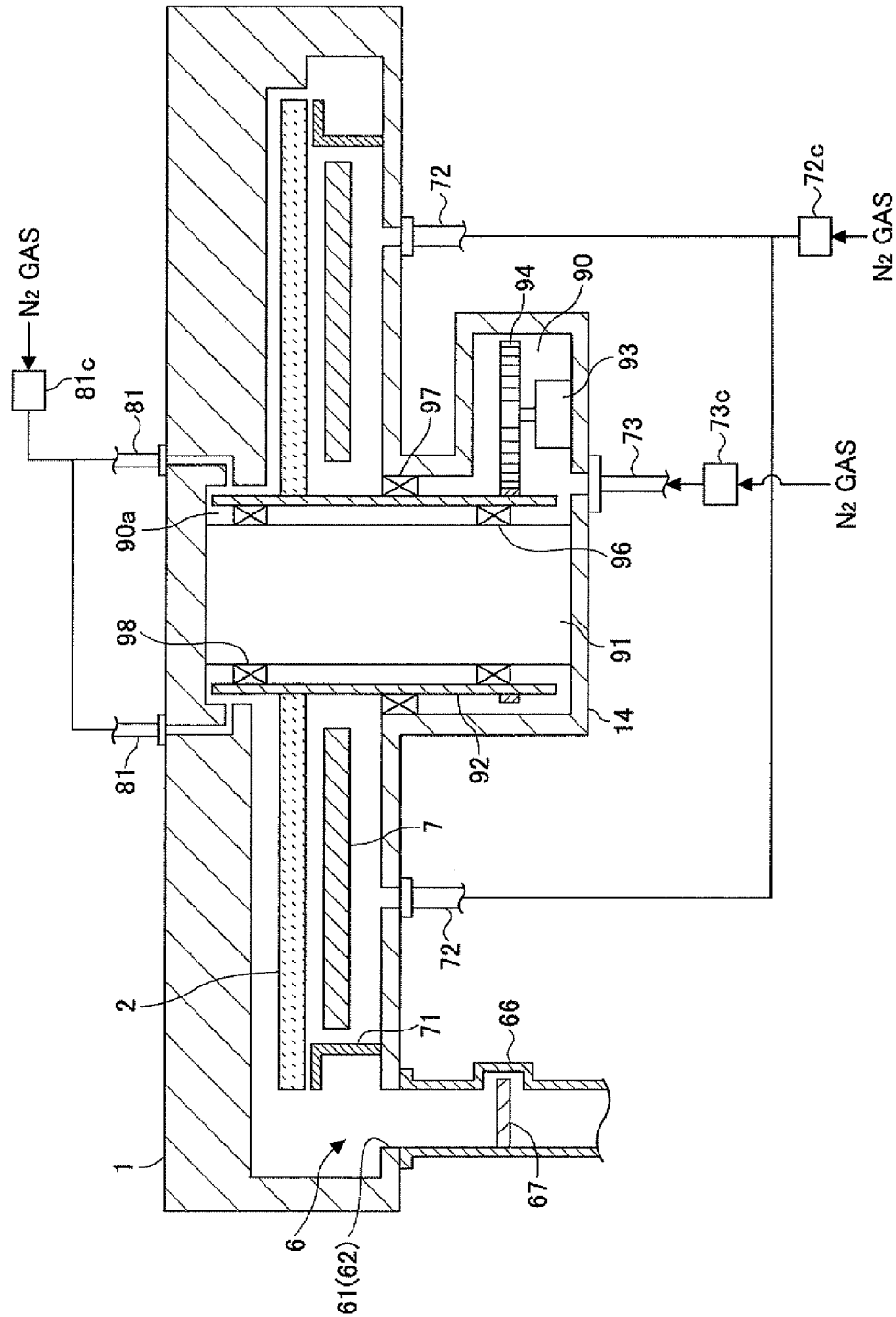
FIG. 18 is a cross-sectional view of another film deposition apparatus according to another embodiment of the present invention.

In the above embodiment, the rotational shaft 22 for the turntable 2 is located in the center of the vacuum chamber 1 and the space defined by the center portion of the turntable 2 and the ceiling plate 11 is purged with the separation gas. However, the film deposition apparatus according to another embodiment may be configured as shown in FIG. 18. In the film deposition apparatus of FIG. 18, the bottom portion 14 of the chamber body 1 is extended downward at the center and a housing space 90 is formed in the extended area. In addition, an upper inner surface (ceiling surface) of the vacuum chamber 1 is dented upward at the center and a concave portion 90a is formed in the dented area. Moreover, a pillar 91 is provided so that the pillar 91 extends from a bottom surface of the housing space 90 through an upper inner surface of the concave portion 90a. This configuration can prevent a gas mixture of the BTBAS gas from the first reaction gas nozzle 31 and the $O_3$ gas from the second reaction gas nozzle 32 from flowing through the center area of the vacuum chamber 1.

A driving mechanism for the turntable 2 is explained in reference to FIG. 18. A rotation sleeve 92 is provided so that the rotation sleeve 92 coaxially surrounds the pillar 91. The turntable 2, which is a ring shape, is attached on the outer circumferential surface of the rotation sleeve 92. In addition, a motor 93 is provided in the housing space 90 and a gear 94 is attached to a driving shaft extending from the motor 93. The gear 94 meshes with a gear 95 formed or attached on an outer circumferential surface of the rotation sleeve 92, and drives the rotation sleeve 92 via the gear 95 when the motor 93 is energized, thereby rotating the turntable 2. Reference numerals "96", "97", and "98" in FIG. 18 represent bearings.

The gas purge supplying pipe 73 is connected to the bottom of the housing space 90, and purge gas supplying pipes 81 for supplying purge gas to the space defined by an inner side wall of the concave portion 90a and the upper portion of the rotation sleeve 92 are connected to an upper portion of the vacuum chamber 1. While two purge gas supplying pipes 81 are shown in FIG. 18, three or more purge gas supplying pipes 81 may be provided, in other embodiments.

In FIG. 18, the space defined by an inner side wall of the concave portion 90a and the upper portion of the rotation sleeve 92 corresponds to the ejection opening that ejects the separation gas toward the top surface of the turntable 2, when seen from the turntable 12. In addition, the center area C located in the center of the vacuum chamber 1 is defined by the ejection opening, the rotation sleeve 91 and the pillar 91.

Figure 19:
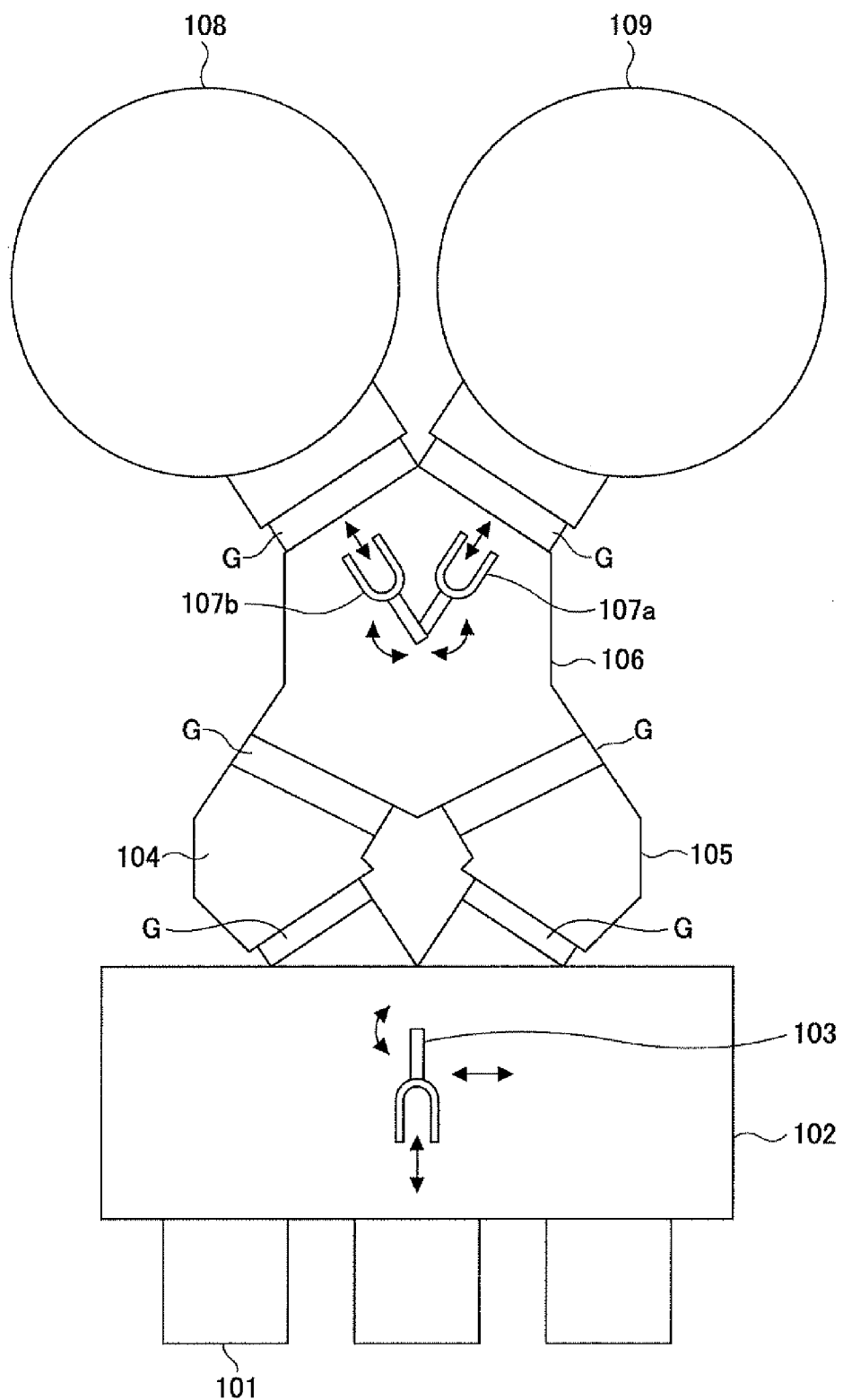
FIG. 19 is a schematic diagram of a substrate process apparatus to which the film deposition apparatus according to embodiments of the present invention is integrated.

The film deposition apparatus according to embodiments of the present invention may be integrated into a wafer process apparatus, an example of which is schematically illustrated in FIG. 19. In this drawing, Reference numeral "101" indicates a closed-type wafer transfer cassette such as a Front Opening Unified Pod (FOUP) that houses, for example, 25 wafers; reference numeral "102" indicates an atmospheric transfer chamber where a transfer arm 103 is arranged; reference numerals "104" and "105" indicate load lock chambers (preparation chambers) whose inner pressure is changeable between vacuum and an atmospheric pressure; reference numeral "106" indicates a vacuum transfer chamber where two transfer arms 107a, 107b are provided; reference numerals "108" and "109" indicate film deposition apparatuses according to an embodiment of the present invention. The wafer transfer cassette 101 is brought into a transfer port including a stage (not shown); a cover of the wafer transfer cassette 101 is opened by an opening/closing mechanism (not shown); and the wafer is taken out from the wafer transfer cassette 101 by the transfer arm 103. Next, the wafer is transferred to the load lock vacuum chamber 104 (105). After the load lock vacuum chamber 104 (105) is evacuated to a predetermined reduced pressure, the wafer is transferred further to one of the film deposition apparatuses 108, 109 through the vacuum transfer vacuum chamber 106 by the transfer arm 107a (107b). In the film deposition apparatus 108 (109), a film is deposited on the wafer in such a manner as described above. Because the wafer process apparatus has two film deposition apparatuses 108, 109 that can house five wafers at a time, the ALD (or MLD) mode deposition can be performed at high throughput.

The reaction gases that may be used in the film deposition apparatus according to an embodiment of the present invention are dichlorosilane (DCS), hexachlorodisilane (HCD), Trimethyl Aluminum (TMA), tris(dimethyl amino)silane (3DMAS), tetrakis-ethyl-methyl-amino-zirconium (TEMAZr), tetrakis-ethyl-methyl-amino-hafnium (TEMHf), bis(tetra methyl heptandionate)strontium $(Sr(THD)_2)$, (methyl-pentadionate)(bis-tetra-methyl-heptandionate)titanium (Ti(MPD)(THD)), monoamino-silane, or the like.

The separation gas and the purge gas are $N_2$ in this embodiment but may be an inert gas such as Ar, $H_2$ or any other gases in other embodiments, as long as the separation gas does not affect the deposition of silicon dioxide.

While the present invention has been described in reference to the foregoing embodiment, the present invention is not limited to the disclosed embodiment, but may be modified or altered within the scope of the accompanying claims.

What is claimed is:

1. A film deposition apparatus for depositing a film on a substrate by carrying out a cycle of supplying in turn at least two kinds of reaction gases that react with each other to the substrate to produce a layer of a reaction product in a chamber, the film deposition apparatus comprising:

a turntable provided in the chamber and including a substrate receiving area in which the substrate is placed;

a first reaction gas supplying portion configured to supply a first reaction gas to a surface of the turntable, the surface having the substrate receiving area;

a second reaction gas supplying portion configured to supply a second reaction gas to the surface, the second reaction gas supplying portion being arranged away from the first reaction gas supplying portion along a circumferential direction of the turntable;

a separation area located along the circumferential direction between a first process area in which the first reaction gas is supplied and a second process area in which the second reaction gas is supplied,
wherein the separation area includes
a lower surface that is lower than a ceiling surface of each of the first and the second process areas in relation to the turntable and has a width becoming substantially greater toward a circumference of the vacuum chamber, the width being along the rotation direction, thereby to create in relation to the turntable a thin space, and
a separation gas supplying portion that is positioned within the lower surface and supplies a first separation gas to the thin space thereby to create separation gas flows from the separation area to the process area sides in relation to the rotation direction;
a first heating unit that heats the first separation gas and allows the heated first separation gas to be supplied from the separation gas supplying portion to the thin space;
an evacuation opening through which the first reaction gas, the second reaction gas, and the first separation gas supplied to the turntable are evacuated; and
a driving portion configured to rotate the turntable in the circumferential direction relative to the first process area, the second process area, and the separation area while the first reaction gas, the second reaction gas, and the first separation gas are supplied to the turntable in order to deposit a film on the substrate.

2. The film deposition apparatus of claim 1, further comprising a center area in which an ejection opening for ejecting a second separation gas to the surface of the turntable, the surface having the substrate receiving area, the center area being located in substantially a center of a chamber in order to separate the atmospheres of the first process area and the second process area,
wherein the first reaction gas and the second reaction gas are evacuated along with the first separation gas that spreads on both sides of the separation area and the second separation gas ejected from the center area from the evacuation opening.

3. The film deposition apparatus of claim 2, wherein the center area is defined by a rotation center portion of the turntable and an inner upper surface of the chamber, and
wherein the second separation gas flows in the center area.

4. The film deposition apparatus of claim 2, wherein a second heating unit configured to heat the second separation gas supplied to the ejection opening is provided in addition to or instead of the first heating unit.

5. The film deposition apparatus of claim 1, wherein the separation area includes ceiling surfaces that are located on both sides of the separation gas supplying portion along the circumferential direction and that create a thin space in relation to the turntable in order to allow the first separation gas to flow through the thin space in a direction from the separation area to the first and the second process areas.

6. The film deposition apparatus of claim 1, further comprising:
a purge gas supplying portion configured to supply a purge gas to a space below the turntable; and
a third heating unit configured to heat the purge gas supplied to the purge gas supplying portion.

7. The film deposition apparatus of claim 1, further comprising a cooling portion configured to cool gas flowing through an evacuation pipe provided between the evacuation opening and an evacuation unit in pressure communication with the evacuation opening.

8. The film deposition apparatus of claim 7, wherein the cooling portion at least partly restricts a gas flow in the evacuation pipe to reduce gas conductance of the evacuation pipe, and
wherein the cooling portion includes a conduit through which a cooling medium for cooling the gas in the evacuation pipe flows.

* * * * *